United States Patent [19]

Iwaki et al.

[11] Patent Number: 5,646,432
[45] Date of Patent: Jul. 8, 1997

[54] SEMICONDUCTOR THIN FILM FORMED ON A SUPPORTING SUBSTRATE

[75] Inventors: Tadao Iwaki; Tsuneo Yamazaki; Katsuki Matsushita; Shigeru Senbonmatsu; Ryuichi Takano, all of Tokyo, Japan

[73] Assignee: Seiko Instruments Inc., Japan

[21] Appl. No.: 57,987

[22] Filed: May 5, 1993

[30] Foreign Application Priority Data

May 14, 1992 [JP] Japan ................... 4-122024

[51] Int. Cl.[6] ............... H01L 27/01; H01L 31/032; H01L 29/00; H01L 23/48
[52] U.S. Cl. ............... 257/347; 257/352; 257/432; 257/506; 257/752
[58] Field of Search ............... 257/347, 352, 257/431, 432, 458, 461, 752, 506, 353, 507, 753, 749

[56] References Cited

U.S. PATENT DOCUMENTS

| | | | |
|---|---|---|---|
| 4,875,086 | 10/1989 | Malhi et al. | 257/506 |
| 4,888,304 | 12/1989 | Nakagawa et al. | 257/506 |
| 4,890,156 | 12/1989 | Drye et al. | 257/506 |
| 5,173,753 | 12/1992 | Wu | 257/347 |
| 5,206,749 | 4/1993 | Zavracky et al. | 257/347 |
| 5,233,211 | 8/1993 | Hayashi et al. | 257/347 |
| 5,334,859 | 8/1994 | Matsuda | 257/347 |
| 5,347,154 | 9/1994 | Takahashi et al. | 257/353 |

*Primary Examiner*—Sara W. Crane
*Assistant Examiner*—Valencia Martin Wallace
*Attorney, Agent, or Firm*—Adams & Wilks

[57] ABSTRACT

A semiconductor substrate is provided which has a semiconductor on insulator structure but in which can be formed a thin film integrated circuit having electrical characteristics and microstructure equal to or of greater density than a silicon integrated circuit formed using a bulk single crystal silicon wafer. The semiconductor substrate has a structure which is formed of a sequentially layered single crystal silicon thin film sandwiched between a thermally oxidized silicon film and a silicon oxide or silicon nitride film, an element smoothing layer, a fluoro-epoxy series resin adhesive layer, and a supporting substrate. The single crystal silicon thin film can have integrated circuit devices formed in a sub-micron geometry similar to that of a bulk single crystal silicon. A transparent glass or a bulk single crystal silicon wafer can be used as a supporting substrate. Therefore the semiconductor thin film can integrate a highly fine, dense and compact semiconductor integrated circuit or semiconductor optical element. The semiconductor thin film element has a transparent optical detection region or optical modulation region with 100 million pixels or more.

49 Claims, 13 Drawing Sheets 1 silicon oxide film
2 single crystal silicon thin film
3 silicon oxide film
6 supporting substrate
5 resin adhesive layer
4 element smoothing film 7 fine particle 4a second element smoothing layer 6a single crystal silicon wafer 8 joint hole

SEMICONDUCTOR THIN FILM FORMED ON A SUPPORTING SUBSTRATE

BACKGROUND OF THE INVENTION

1. Field of the Invention

The present invention relates to a semiconductor thin film element which can build a thin film silicon circuit having electrical characteristics and a fine structure, similar to or more than those of a silicon circuit using a single crystal silicon wafer; a system applying the same; and a method of making the semiconductor thin film element.

2. Description of the Related Arts

In conventional semiconductor thin film elements using glass substrate and silicon, thin film transistors have been formed on the surface of an amorphous silicon thin film or polycrystalline silicon thin film deposited on a glass substrate. The amorphous silicon thin film and polycrystalline silicon thin film are suitable to manufacture semiconductor thin film elements (for instance, a substrate for active matrix liquid crystal devices) with a relatively large area because they can be easily deposited on a glass substrate using chemical vapor deposition method.

Recently, thin film switching elements have been formed each which has a two layered structure being of an insulating substrate and a semiconductor crystal formed thereon. Various types of switching elements having such a two-layered structure have been known. They are the so-called silicon-on-insulator (SOI) substrates. The SOI substrate can be produced by depositing a polycrystalline silicon thin film on a substrate surface of, for example, insulating material using chemical vapor deposition method, and then by heating it using a laser beam to recrystalize the polycrystalline to a single crystal structure. Another type of SOI substrate can be produced by oxidizing thermally the surface of a single crystal silicon wafer, then by subjecting it to a thermo-press bonding with a silica substrate or a single crystal silicon substrate, and finally by polishing or etching to process the single crystal silicon wafer to a predetermined thickness.

However, in conventional semiconductor thin film elements using amorphous or polycrystalline silicon thin film, sub-micron transistor elements cannot be formed by applying the fine semiconductor manufacturing technique. For example, since the amorphous silicon thin film is formed at a temperature of about 800° C., high temperature processing necessary to the miniaturizing technology cannot be carried out. Furthermore, since the polycrystalline silicon thin film used for a semiconductor thin film element has a crystalline grain size of several µm, it is limited naturally to miniaturize a thin film element. Since the polycrystalline silicon thin film is formed at a temperature of about 600° C., it is impossible to employ fully the miniaturizing technique where processing at a high temperature of more than 1000° C. includes.

Generally the SOI substrate which is formed by recrystalizing a polycrystalline film to convert to a single crystal structure does not have a uniform crystalline structure and has large lattice defect density. In the SOI substrate which is formed by thermo-press bonding a single crystal silicon and a silica substrate, there is a disadvantage in that since the difference in thermal expansion coefficient between the single crystal silicon and the silica substrate is large, the silicon thin film may peel or crack during a high temperature process at over 1000° C. Moreover there have been no transparent insulating substrates which is at low prices, has a coefficient of thermal expansion similar to that of a single crystal silicon, and has a resistant property under high temperature processing over 1000° C. For that reason, it has been difficult to apply a device miniaturizing technology utilized to the single crystal silicon wafer to the SOI substrate manufactured through conventional method. The SOI substrate which is formed by thermo-press bonding single crystal silicon wafers to each other can be easily formed semiconductor circuit elements on a single crystal silicon thin film by applying the device miniaturizing technology under over 1000° C. However there is a disadvantage in that it has been difficult to form a three-dimensionally integrated semiconductor circuit element since semiconductor circuit elements cannot be nearly formed over both the internal surfaces at the thermo-press bonded portion.

SUMMARY OF THE INVENTION

In order to overcome the above problems, the semiconductor thin film element according to the present invention is made by forming sequentially a thermally oxidized silicon film; a single crystal silicon thin film sandwiched between silicon oxide films or silicon nitride films; an element smoothing layer; a resin adhesive layer; and a glass substrate.

A SOI substrate is formed by subjecting them to a thermo-press bonding after the surfaces of two single crystal silicon substrates are thermally oxidized; and then processing one of the silicon substrates to a predetermined thickness through polishing or etching. In the SOI substrate, since there is no difference between coefficients of thermal expansion of the materials bonded to each other, electrical circuits of sub-micron order can be easily formed on the surface of the single crystal silicon thin film by performing the device miniaturizing process under over 1000° C. In the SOI substrate formed thus, after a surface where no electrical circuits are formed is adhered with the above structure, the single crystal silicon substrate where no electrical circuits are formed are removed through polishing and etching. According to the present invention, it is possible to solve the above problem since three dimensional semiconductor circuit elements in both the inner surfaces can be formed which are connected electrically to each other in the adhesive layer.

The other objects and features of the present invention will be described in detail in the following in connection with the embodiments thereof.

BRIEF DESCRIPTION OF THE DRAWINGS

FIG. 14A–14C-2 is a flow chart showing the bonding and separating steps in the second step in the semiconductor thin film element manufacturing process according to the present invention;

DETAILED DESCRIPTION OF THE PREFERRED EMBODIMENTS

Figure 1:
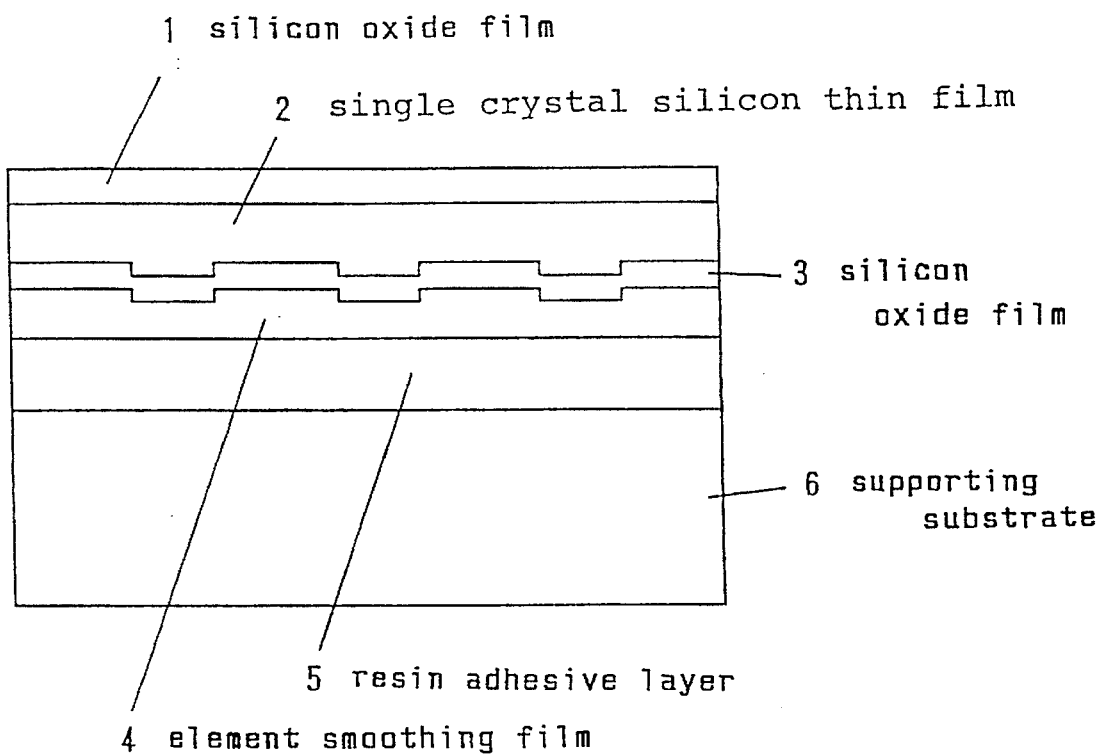
FIG. 1 is a typical cross sectional view showing a semiconductor thin film element structure according to the present invention.

An explanation will be made below as for an embodiment according to the present invention with reference with drawings. FIG. 1 is a model cross sectional view showing a semiconductor thin film element structure according to the present invention. Numeral 1 represents a thermally oxidized silicon oxide film, 2 represents a single crystal silicon thin film, 3 represents a silicon oxide film, 4 represents an element smoothing layer, 5 represents a resin adhesive layer, and 6 represents a supporting substrate. A semiconductor circuit element is formed on the single crystal silicon thin film 2 by applying a miniaturizing semiconductor structure manufacturing technique. The silicon nitride film may be used instead of the thermally oxidized silicon film 3.

The single crystal silicon used for the single crystal silicon thin film 2 is made of a SOI substrate. The SOI substrate is formed by subjecting the single crystal silicon wafer explained in the prior art to a thermally grown oxidizing process, then by bonding thermally and compressively it with a single crystal silicon substrate, and by processing the single crystal silicon wafer to a predetermined thickness through polishing or etching. Since the quality of the single crystal silicon wafer is maintained substantially as it is, the SOI substrate has an excellent quality as for the uniformity of crystal orientation and lattice defect density.

Therefore the crystal orientation can be selected arbitrarily and a semiconductor circuit element can be formed accurately and in high density using conventional miniaturizing semiconductor manufacturing method. The thickness of the single crystal silicon thin film 2 can be taken to any values more than about 0.3 μm. However in order to operate normally a thin film transistor built using the conventional miniaturizing semiconductor manufacturing method, the thickness is necessary to be over 0.6 μm, or preferably over 0.8 μm.

In the similar manner to the single crystal silicon thin film 2, the thermally oxidized silicon oxide film 1 also is made from the SOI substrate. The semiconductor circuit element is formed on the single crystal silicon film 2. The single crystal silicon thin film 2 is adhered to the supporting substrate 1 with the resin adhesive layer 5 by way of the silicon oxide film or silicon nitride film 3 and the element smoothing layer 4. When the single crystal silicon substrate is removed through polishing or etching, the thermally oxidized silicon film 1 blocks the polishing or etching while protects electrically the semiconductor circuit element formed in the single crystal silicon thin film from external environment. The thickness of the thermally grown silicon thin film is determined when the SOI substrate is formed. If the single crystal substrate is removed through, for example, anisotropic etching using usual KOH solution, the thickness is necessary to be at least 0.1 μm in consideration of the parallelism and flatness of the single crystal silicon substrate as well as the etch rate difference between the silicon and the thermally oxidized silicon.

The silicon oxide film or the silicon nitride film 3 moderates the internal stress occurring within the single crystal silicon thin film 2 while prevents the single crystal silicon thin film 2 from being peeled due to polishing or etching. The silicon oxide film or the silicon nitride film 3 also stabilizes the characteristics of the semiconductor circuit element, prevents a breakage of the metal electrode due to an internal stress, and improves the mechanical strength of the single crystal silicon thin film 2. In order to make full use of such functions, it was proven that the thickness of the silicon oxide film or silicon nitride film 3 is sufficient to be less than 2 μm. It is preferable to has a thickness of substantially 2 μm if possible.

When the single crystal silicon thin film 2 with the semiconductor circuit element formed therein is adhered to the supporting substrate 1 with the resin adhesive layer 5 by way of the silicon oxide film or silicon nitride film 3, and the element smoothing layer 4, the element smoothing layer 4 can reduce the internal stress in the resin adhesive layer 5 caused by curing or shrinkage of the adhesive agent, thus preventing the single crystal silicon thin film 2 from being peeled through polishing or etching. It is desirable that the element smoothing layer fattens completely the surface of the oxide silicon film or the nitride silicon film 3. A large effect can be sufficiently obtained even by rounding the edges of the roughed surface. It is quite natural that making the element smoothing layer 4 can improve mechanically the single crystal silicon thin film 2.

It is desirable to use a silicon oxide as well as an imide type resin or epoxy type resin as a material for the element smoothing layer 4. The oxide silicon is made by solving an organic type silicon compound such as silicon alkoxide with a solvent, by coating the solution on the silicon oxide or silicon nitride film 3, and then by heating it at 150° to 300° C. The imide type resin or epoxy type resin is made by coating an imide type monomer or epoxy type monomer using a solvent, and then by heating to cure it. The thickness of the element smoothing layer 4 is less than 2 μm. The thickness of more than 2 μm causes an internal stress in the element smoothing layer 2, thus resulting in peeling the single crystal silicon thin film 2.

Any kinds of materials may be used for the supporting substrate 1. Heat which occurs during the semiconductor thin film element manufacturing steps according to the present invention causes an internal stress in the single crystal silicon thin film 2 or the resin adhesive layer 5. The stress may vary the characteristics of the semiconductor circuit element with time and peel the single crystal silicon thin film 2 from the supporting substrate 1.

It is desirable to use a supporting substrate which can provide the difference in coefficient of linear expansion of less than $1.5 \times 10^{-6}/°$ C. between the supporting substrate 1 and the single crystal silicon. For example, in order to manufacture transparent type optical elements using the semiconductor thin film elements according to the present invention, Pyrex glass may be used for glass substrate. Silicon single crystal wafer may be used to manufacture reflex type optical elements and three-dimensional semiconductor circuit elements.

In the polishing, etching, and various cleaning steps for manufacturing the semiconductor thin film element according to the present invention, the resin adhesive layer 5 must withstand corrosion due to etching fluid and cleaning fluid while it must have strong adhesive power. Fluorine epoxy series resin material was suitable for the resin adhesive layer 5. This material is an epoxy series resin including fluorine in various ratios as adjective radical and has good chemical resistance. The adhesive layer can be controlled in refractive index and viscosity before curing by adjusting properly the amount of fluorine.

The resin adhesive layer 5 may have a thickness of any values, normally, 2 to 50 μm. The thickness can be controlled by adjusting the load applied against the single crystal silicon and the supporting substrate 1 at the adhering time, and the viscosity of the resin adhesive layer 5 prior to curing. In the most semiconductor thin film elements according to the present invention, the resin adhesive layer 5 is controlled to a thickness of 10 to 20 μm.

Figure 2:
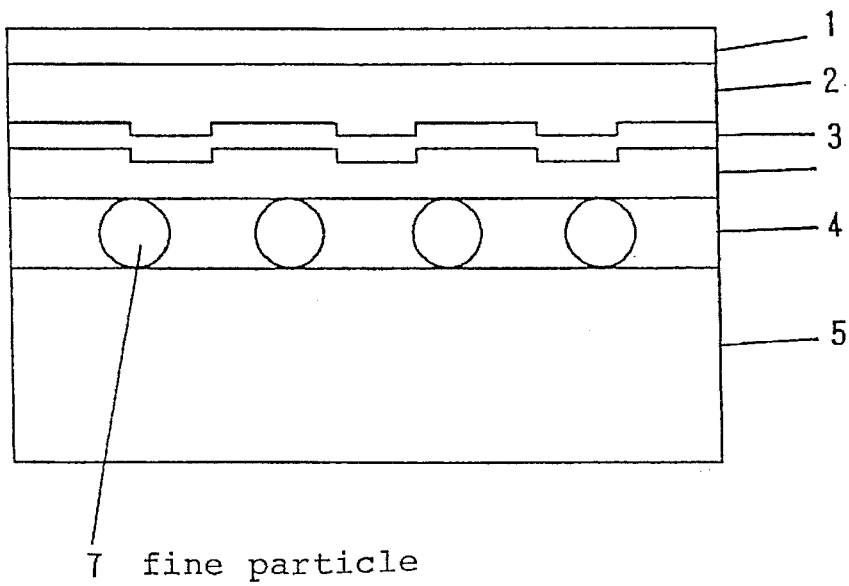
FIG. 2 is a structural view showing an semiconductor thin film element according to the present invention which can extremely minimize variations in thickness of a resin adhesive layer.

However, it is difficult to minimize variations in thickness of the resin adhesive layer 5 by using conventional adhering method. FIG. 2 shows the semiconductor thin film element structure according to the present invention which can minimize extremely the variations in thickness of the resin adhesive layer 5. In comparison with FIG. 1, there is a difference in that fine particles 7 are mixed in the resin adhesive layer 5 to control the thickness thereof, as shown in FIG. 2. fiber balls or beads made of silicon dioxide or high molecular resin may be used as the fine particles 7. The beads or fiber beads are controlled to a predetermined diameter +−1 to 15%. The fine particles are commercially available with various diameters thereof.

The above thickness controlling method has been used to adjust the thickness of liquid crystal layer of liquid crystal elements. The resin adhesive layer 5 can be controlled to a predetermined thickness ±1 to ±5% by mixing fine particles of controlled diameters in the resin adhesive layer 5. Fine particles 7 with a diameter of 5 to 15 μm have been used in the present invention.

Figure 3:
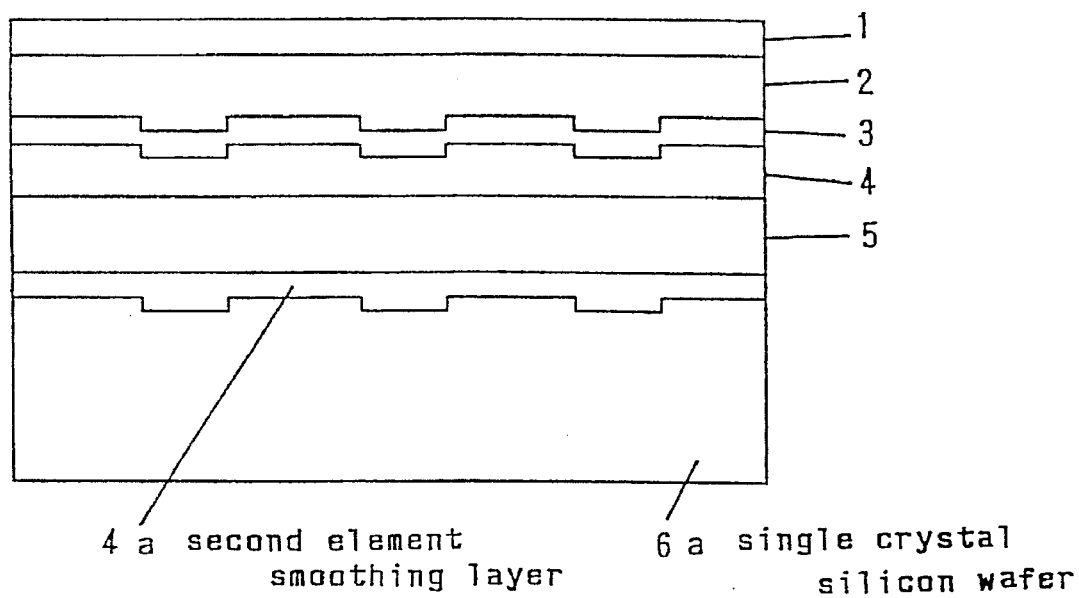
FIG. 3 is a typical cross sectional view showing an embodiment of a semiconductor thin film element according to the present invention in case a semiconductor circuit element is formed on a single crystal silicon wafer.

FIG. 3 shows a model cross sectional view of the embodiment where the supporting substrate 6 is a single crystal silicon wafer 6a on which semiconductor circuit elements are formed. The difference between FIG. 3 and FIG. 1 is that semiconductor circuit elements are formed on the single crystal silicon wafer 6a being a supporting substrate while the a second element smoothing layer 4a is formed between the resin adhesive layer 5 and the single crystal silicon wafer 6a. The semiconductor circuit elements are formed on the single crystal silicon thin film 2 and the single crystal silicon thin film 2 is adhered to the supporting substrate 1 with the resin adhesive layer 5 by way of the silicon oxide of silicon nitride film 3 and the element smoothing layer 4. Why the second smoothing layer 4a is formed is because it can reduce the internal stress in the resin adhesive layer 5 caused by curing and shrinkage of the resin adhesive agent, thus preventing the single crystal silicon thin film 2 from peeling during the polishing and etching. The second element smoothing layer 4a has a thickness of less than 2 μm.

The two-layered semiconductor circuit element formed thus can couple optically semiconductor circuit elements formed on the single crystal silicon thin film 3 to semiconductor circuit elements formed in the single crystal silicon wafer 6a, thus packing substantially a large-scale integrated circuit in a small area without delaying clocks.

Figure 4:
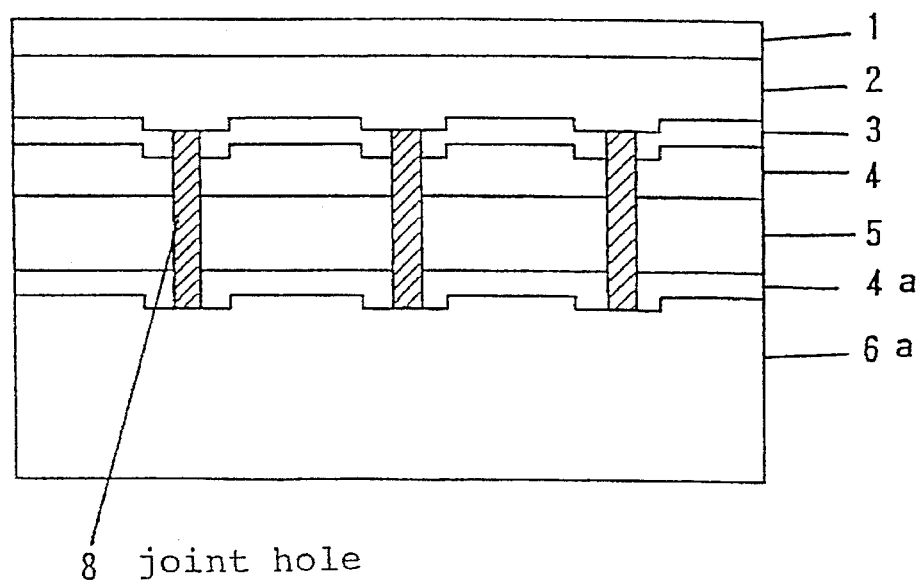
FIG. 4 is a typical cross sectional view showing an embodiment of two layered semiconductor circuit element connected electrically to a semiconductor thin film element according to the present invention where a semiconductor circuit element is formed on a single crystal silicon wafer.

Moreover, in the similar manner to in FIG. 3, FIG. 4 shows a model cross sectional view showing an embodiment where two layered semiconductor circuit elements are electrically coupled to each other. FIG. 4 differs from FIG. 3 in that joint holes 8 of electrical conductive material such as metal are formed. The joint holes 8 are penetrate the thermally oxidized silicon 1, the single crystal silicon thin film 2, the silicon oxide or silicon nitride 3, the element smoothing layer 4, the resin adhesive layer 5, and the second element smoothing layer 4a. The joint holes 8 also connect electrically the semiconductor circuit elements formed in the single crystal silicon thin film 2 to the semiconductor circuit elements formed in the single crystal silicon wafer 6a. The joint holes 8 can be easily formed using a miniaturizing semiconductor manufacturing technique and a thin film forming method. Holes with a desired depth, for example, are formed at a desired position through a dry etching in oxygen atmosphere and then a metal material such as aluminum or chromium are sputtered at .the desired position thereof.

Figure 5:
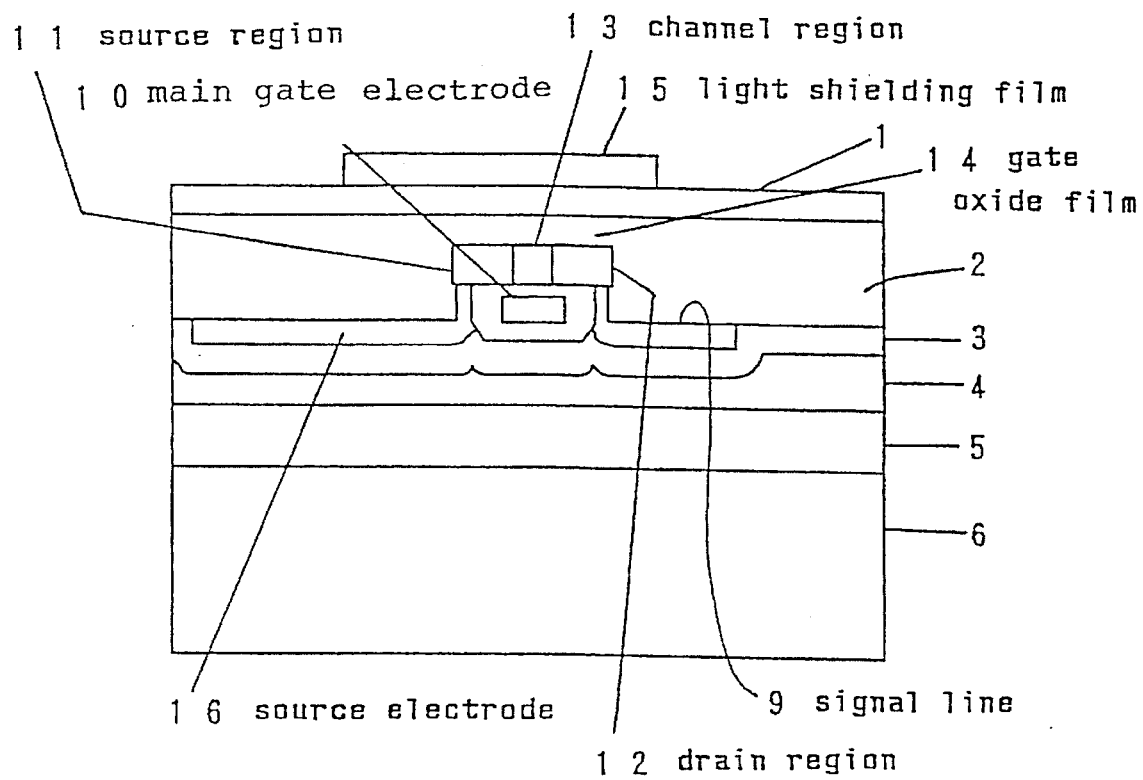
FIG. 5 is a diagram showing the structure of a transistor formed in the single crystal silicon thin film of a semiconductor thin film element according to the present invention.

FIG. 5 shows a transistor structure formed in a single crystal silicon thin film of the semiconductor thin film element according to the present invention. In FIG. 5, the transistor has a drain region 12 and a source region 11 which are formed separately in the single crystal silicon thin film 2. The drain region is connected to the signal line 9 while the source region 11 is connected to the source electrode 16. A channel region 13 is arranged between the drain region 12 and the source region 11. A main gate electrode 10 is formed on the back side of the channel region 13 by way of the gate oxide film 14. The main gate electrode 10 controls the conductance of the channel region 13 and performs on/off operation of the transistor.

A light shielding film 15 is arranged on the back surface of the channel region via the gate oxide film and the thermally oxidized silicon film 1. The light shielding film 15 is formed of a metal material thin film such as chromium, aluminum, or molybdenum and acts as a sub-gate electrode for controlling the back channel. The sub-gate electrodes 10 and 15 arranged on both sides of the channel region 13 is made of a light shielding material and can shield perfectly the light entering the channel region 13.

According to the present invention, the channel region 13 is formed in a single crystal silicon thin film. A conventional LSI processing technique is directly applicable to fine the channel length thereof to an order of submicron.

The semiconductor circuit element such as a transistor in a laminated structure on a single crystal silicon thin film, as shown in FIG. 5, has a roughed surface. When the semiconductor circuit element with the rough structure is adhered directly to the supporting substrate 6 with the resin adhesive layer 5, an internal stress may occur in the resin adhesive layer 5, thus peeling off the semiconductor circuit element 2. For that reason, the rough surface is smoothed or flattened using the element smoothing layer 4 of silicon oxide or imide series resin.

The resin adhesive layer 5 may be used with fine particles mixed.

Figure 6:
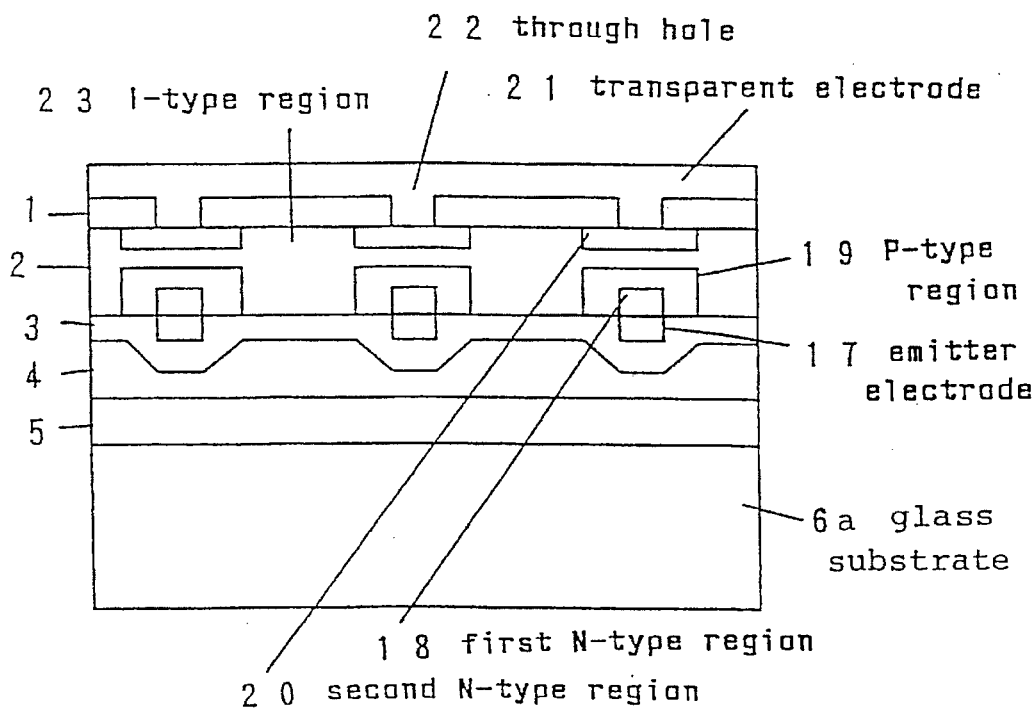
FIG. 6 is a diagram showing an embodiment of an optical detector formed in a semiconductor thin film element according to the present invention.

Next, an embodiment according to the present invention is shown where an optical detector is built in a semiconductor thin film element. In FIG. 6, numeral 6a represents a glass substrate, 17 represents an emitter electrode, 18 represents a first N-type region, 19 represents a P-type region, 20 represents a second N-type region, 21 represents a transparent electrode, 23 represents I-type region, and 22 represents a through hole.

Unlike the above embodiment, the present embodiment employs a transparent glass substrate as a supporting substrate. A Pyrex glass is used as the glass substrate. The Pyrex glass has coefficient of linear expansion of about $3 \times 10^{-6}/°$ C. at normal temperature. The value is close to coefficient of linear expansion of the silicon, or, about $2.4 \times 10^{-6}/°$ C. at normal temperature. Silica glass (about $0.4 \times 10^{-6}/°$ C. in coefficient of linear expansion at normal temperature) or soda glass (about $8 \times 10^{-6}/°$ C. in coefficient of linear expansion at normal temperature) has a larger difference in coefficient of linear expansion to silicon. A thermal stress at junction which occurs in a semiconductor thin film element may peel off the adhered portion. In order to prevent the element peeling, it was found that a glass material which provides coefficient of linear expansion difference of less $1.5 \times 10^{-6}/°$ C. between it and the single crystal silicon may be used.

FIG. 6 shows an optical detector being a three electrode element with an NPN junction. The three electrode element requires no base electrode because light works as a base current. That is, the present optical detector is switched in response to light illumination. The optical detector includes a first N-type region 18 and a P-type region 19, and a second N-type region 20 formed separately in the single crystal silicon thin film 2. An intrinsic I-type region 23 is formed between the P-type region 19 and the second N-type region 20. The second N-type region 20 is connected electrically to the transparent electrode 21 such as ITO electrode by way of the through hole 22. The transparent electrode 21 corresponds to the collector electrode of a transistor. The first N-type region 18 is connected to the emitter electrode 17.

The transparent electrode 21 thus connected is used as a positive electrode. When the present optical detector is illuminated with light while a voltage is applied between the emitter electrode 17 and the transparent electrode 21, light current is obtained corresponding to the amount of illuminated light. The structure including the emitter region 17, the P-type region 19, and the like can be easily formed on the single crystal silicon thin film underlying the SOI substrate, using the conventional miniaturized semiconductor manufacturing technique. Hence an optical detector, as shown in FIG. 6, can be made according to the semiconductor thin film element manufacturing method according to the present invention (to be described later).

According to the present invention, a two terminal optical detector with PN junction can be used in place of the three terminal photo detector with NPN junction as shown in FIG. 6.

Next an explanation will be made regarding a semiconductor circuit element formed in the thin film semiconductor element according to the present invention.

An explanation will be made first how to manufacture a SOI substrate. Another single crystal silicon wafer is prepared together with the single crystal silicon wafer 25.

It is desirable to use a high quality silicon wafer for manufacture as the single crystal silicon wafer. The crystalline orientation is <100>. The uniformity ranges 0.0±1.0. The single crystal lattice defect density is less than 500/cm². After the surface of another single crystal silicon wafer has been precisely polished, a thermally oxidized silicon is formed on one or both surfaces thereof. Consequently, one silicon wafer is piled on the thermally oxidized silicon on at least one surface of the other silicon wafer. Then both the silicon wafers are heated and thermo-press bonded to each other. The thermo-press bonding process fixes securely both the wafers to each other.

Next the surface of the other single crystal silicon wafer is polished. As a result, in the structure, as shown by the structural cross-sectional view in FIG. 8, the single crystal silicon wafer 25, the thermally oxidized silicon film 1, and the single crystal silicon thin film 2 are formed. In order to form the single crystal silicon thin film 2, the other single crystal silicon wafer may be thinned either by etching, or by polishing and etching instead of polishing.

Since the single crystal silicon thin film 2 thus obtained maintains substantially the quality of the single crystal silicon wafer, it can be a very good film as for an uniformity of crystalline orientation and a lattice defect density. On the contrary, the conventional single crystal silicon thin film formed of deposited amorphous or recrystalized polycrystalline silicon thin film is not stable for LSI manufacture because of an existence of many lattice defects and no uniformed crystal orientation. The SOI substrate producing method explained above has been well-known.

Figure 14A:
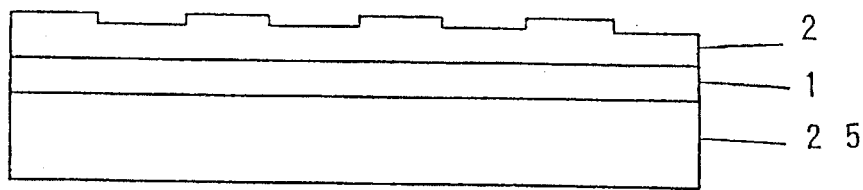
Figure 14B:
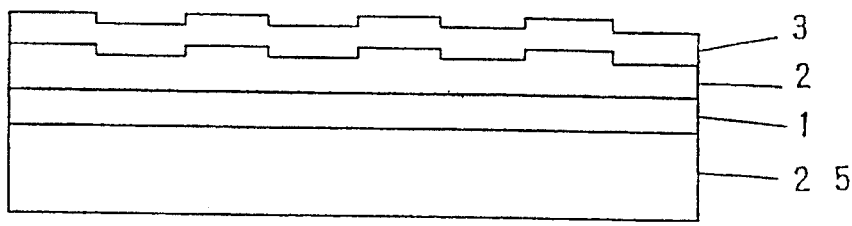

An explanation will be made below as for the semiconductor thin film element manufacturing method according to the present invention with reference to FIGS. 14 and 15. A semiconductor circuit element is formed on the single crystal silicon thin film 2 of the above SOI substrate, according to the below mentioned steps shown in FIG. 14(A). As shown in FIG. 14(B), the silicon oxide film or silicon nitride film 3 is formed on the thin film 2 using either physical vapor deposition method including sputtering and vacuum vapor deposition or chemical vapor deposition method, The silicon film 3 protects the semiconductor element while it moderates an internal stress in the single crystal silicon thin film 2. The thickness of the silicon oxide film or silicon nitride film 3 depends on the thickness of the single crystal silicon thin film 2 or the semiconductor circuit element structure. The thickness may be less than about 2 μm, or, preferably 1 to 2 μm.

Figure 14C:
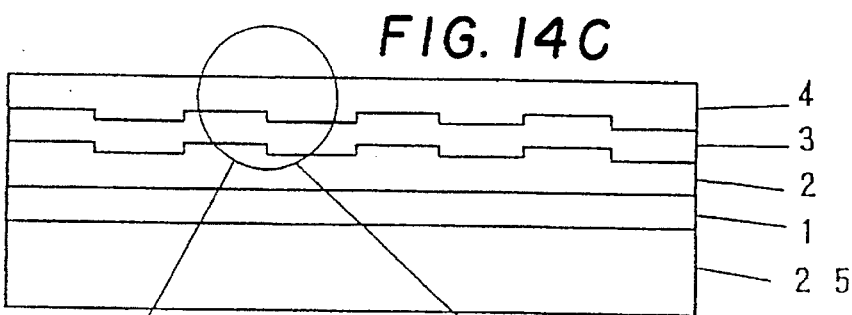
Figures 1, 2, 14C:
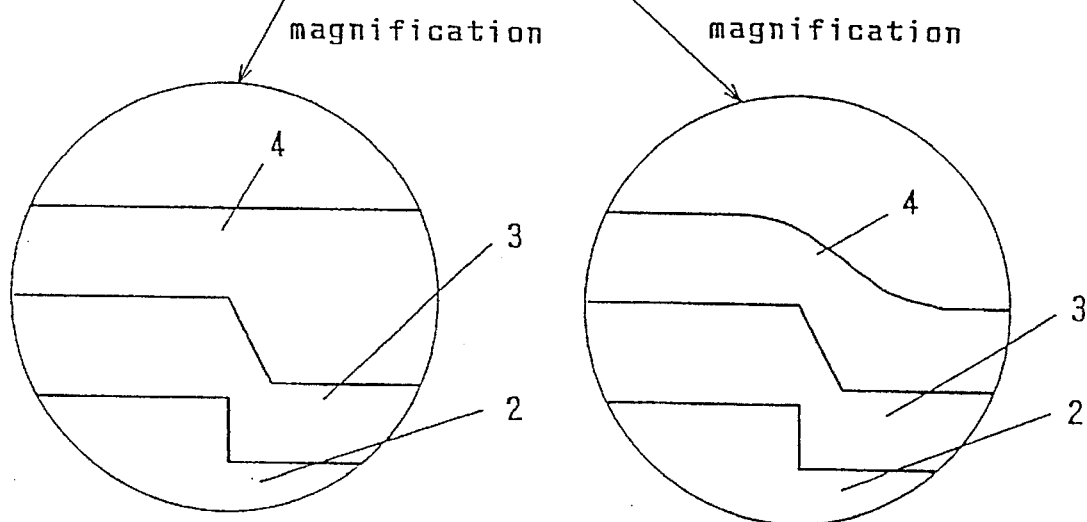

Next, as shown in FIG. 14(C), an element smoothing layer 4 is formed on the silicon oxide film or silicon nitride film 3 in order to smooth the rough surface of the semiconductor circuit element formed in the single crystal silicon thin film 2. An embodiment for forming the smoothing layer 4 will be explained. An organic silicon compound such as silicon alkoxide is dispersed and solved with an organic solvent. The resultant solution is spin-coated on the SOI substrate on which the silicon oxide film or silicon nitride film 3 is formed. The coating amount depends on the revolution number of a spin coater, the viscosity of a coating material, filling amount, or initial spreading distribution.

The SOI substrate is heated in an atmosphere of 50° to 180° C. to react the organic silicon compound dispersed and dissolved with an organic solvent which is coated thereon. Thus the element smoothing layer 4 of silicon oxide is formed on the silicon oxide film or silicon nitride film 3. The silicon oxide 4, as shown in FIG. 14(C-2), smoothes the rough surface of the silicon oxide film or silicon nitride film 3 due to the semiconductor circuit element. Next an explanation will be explained as for the second embodiment for forming the element smoothing layer 4. After an imide type resin solvent is spin-coated on the SOI substrate on which the silicon oxide or silicon nitride 3 are formed, it is converted to a polyimide type polymer layer 4 through heating at 140° to 180° C. As shown in FIG. 14(C-1), the polyimide type polymer 4 thus formed can smooth completely the rough surface of the silicon oxide film or silicon nitride film 3 formed due to an aftereffect of the semiconductor circuit element. It is preferable that the thickness of the element smoothing layer is about less than 2 μm.

Figure 15A:
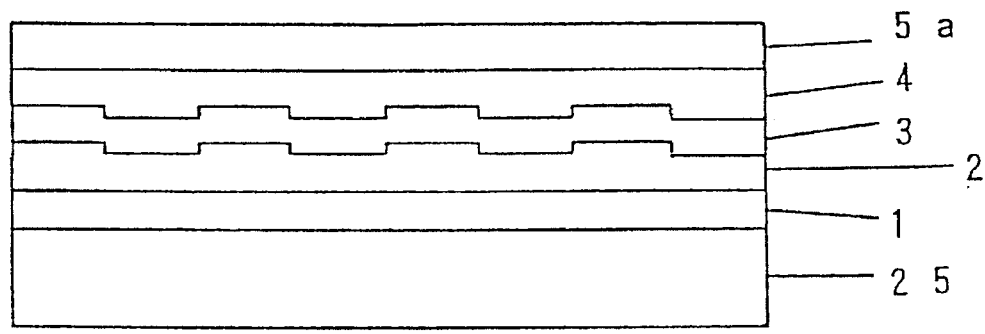
FIG. 15A–15C is a flow chart showing the bonding and separating steps in the second step in the semiconductor thin film element manufacturing process according to the present invention.
Figure 15B:
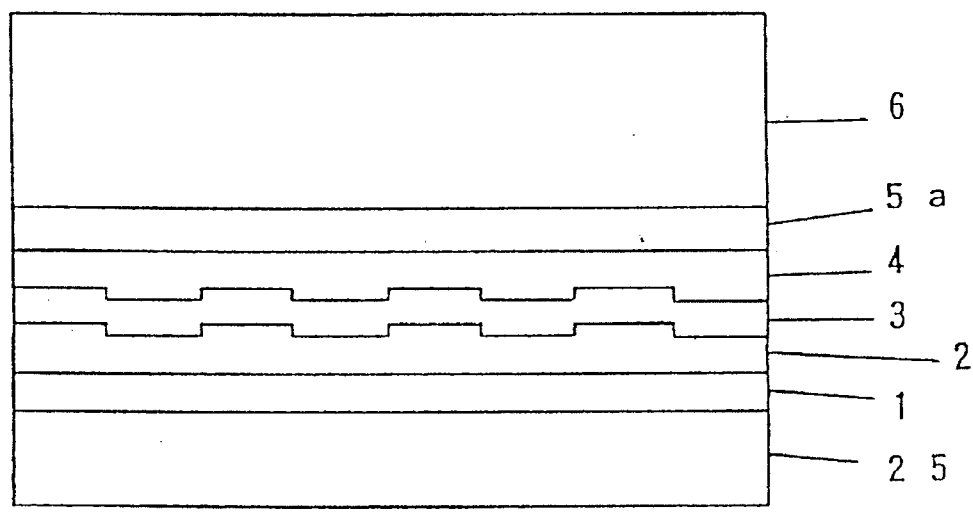
Figure 15C:
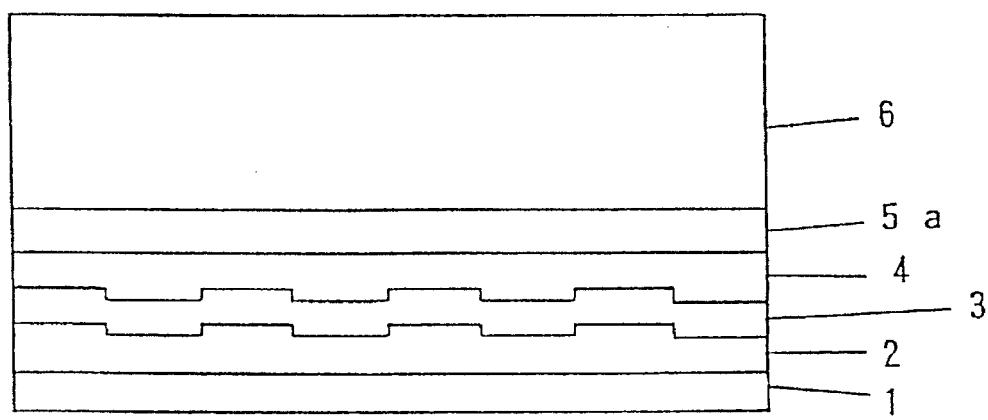

The single crystal silicon wafer 25, as shown in FIG. 15(C), is removed accordance to the following steps. The element smoothing layer 4 prevents the single crystal silicon thin film 2 from being peeled and reinforces it mechanically. Therefore the material for the element smoothing layer 4 must be a material which has sufficiently a corrosion resistance against an etching fluid used in the above removing step.

An adhesive agent 5a, as shown in FIG. 15(A), is coated on the element smoothing layer 4. After a curing process, it is necessary to use as the adhesive agent 5a a material which has a strong corrosion resistance against an etching fluid used in the step for removing the single crystal silicon wafer 25, as shown in FIG. 15(C). An ultraviolet curing adhesive agent where fluorine epoxy type monomer is cured by ultraviolet rays was used in the embodiment according to the present invention. Sequentially, the supporting substrate 6 which is formed of glass and single crystal silicon wafer is bonded, adhered, and cured with the SOI substrate by using the adhesive agent 5a. The adhesive agent 5a cured, as shown in FIG. 15(B), becomes a resin adhesive layer 5. The ultraviolet curing adhesive agent as the adhesive agent 5a can omit a heating process for curing. Adhesive agent (for example, general epoxy type adhesive agent and low melting point glass) which requires a heating process for curing may bend generally the supporting substrate or SOI substrate after curing it because of a difference in coefficient of thermal expansion between the supporting substrate 6 and the single crystal silicon wafer 25. As a result, good semiconductor thin film elements cannot be manufactured. However, such a problem does not occur when a single crystal silicon wafer is used as the supporting substrate 6.

When an ultraviolet curing adhesive agent is used as the adhesive agent 5a, the substrate is risen to about 50° C. through an ultraviolet illumination. Hence when a glass substrate is used as the supporting substrate 6, it is desirable to use Pyrex glass because the different in coefficients of thermal expansion between the supporting substrate and the single crystal silicon wafer 25 is small. It was found that the difference between coefficients of thermal linear expansion between the single crystal silicon wafer 25 and the substrate 6 is less than $1.5 \times 10^{-6}/°$ C.

After the supporting substrate 6 is adhered with the SOI substrate via the resin adhesive layer 5, the single crystal silicon wafer 25 is polished with a diamond blade to a thickness of about 100 μm. Then the single crystal silicon wafer 25 is controlled to a thickness of about 70 μm by performing a rough and finish polishing using an abrasive such as cerium oxide and alumina. The SOI substrate is immersed in 35% KOH solution at 80° C. and the single crystal silicon wafer 25 is completely removed by anisotropic etching. The etching can be completely stopped by the thermally oxidized silicon layer 1 because the etching rate is different between the single crystal silicon wafer 25 and the thermally oxidized silicon film 1 several hundreds times. The thin film semiconductor element according to the present invention Can be made as shown finally in FIG. 15(C).

Figure 12A:
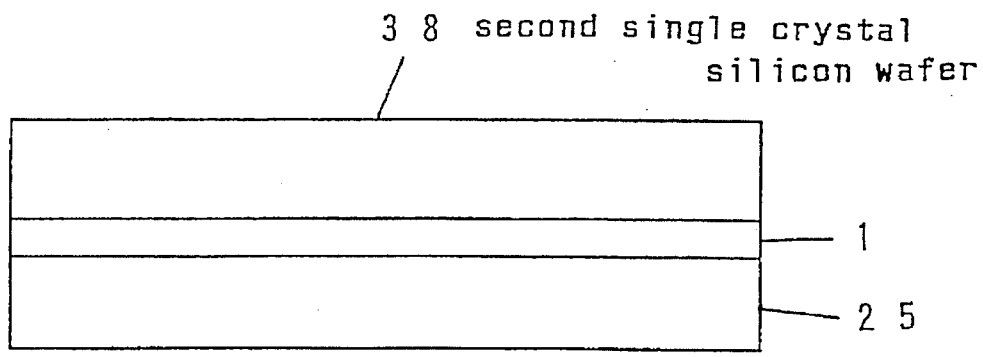
FIG. 12A–12D is a flow chart illustrating fine processing of the first step in a semiconductor thin film element manufacturing process according to the present invention.
Figure 12B:
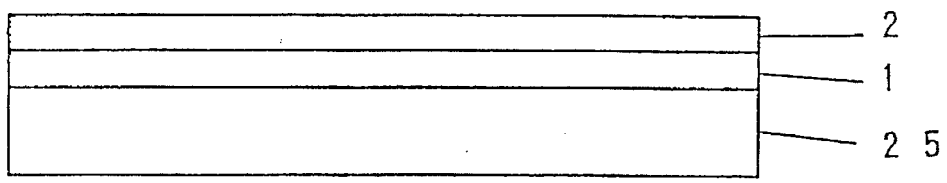

Next an explanation will be made as for a method of manufacturing a thin film transistor which is a basic element when a semiconductor circuit element for a thin film semiconductor element according to the present invention is formed on the single crystal silicon thin film. FIGS. 12 and 13 are a flow chart for forming a thin film transistor in a thin film semiconductor element according to the present invention, respectively. After the single crystal silicon wafer 25 and the second single crystal silicon wafer 38 are thermo-press bonded and bonded by way of the thermally oxidized silicon film 1 (FIG. 12(A)), the second single crystal silicon wafer 38 is thinned through polishing and etching to obtain the SOI structure, as shown in FIG. 12(B). The single crystal silicon thin film 2 is processed to a thickness of more than 0.6 μm. It is not desirable that the thickness of less than 0.6 μm degrades largely the operational characteristics of the thin film transistor.

Figure 12C:
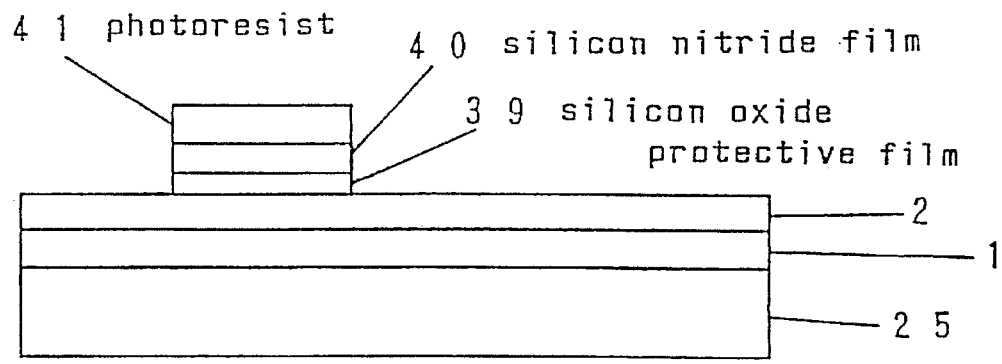

In the step shown in FIG. 12(C), a silicon oxide protective layer 39 is formed on the entire surface of the silicon semiconductor thin film 2 by thermally oxidizing. A silicon nitride protective film 40 is deposited on the silicon oxide protective film 39 by performing chemical vapor deposition method. A photoresist 41 is coated on the protective film 40. The photoresist 41 is patterned through a photolithography and then removed except thin film transistor forming regions (hereinafter referred to an element region). The silicon oxide protective film 39 and the silicon nitride protective 40 which are not covered with the photoresist 41 are removed by performing etching. FIG. 12(C) shows that the SOI substrate is under processing.

Figure 12D:
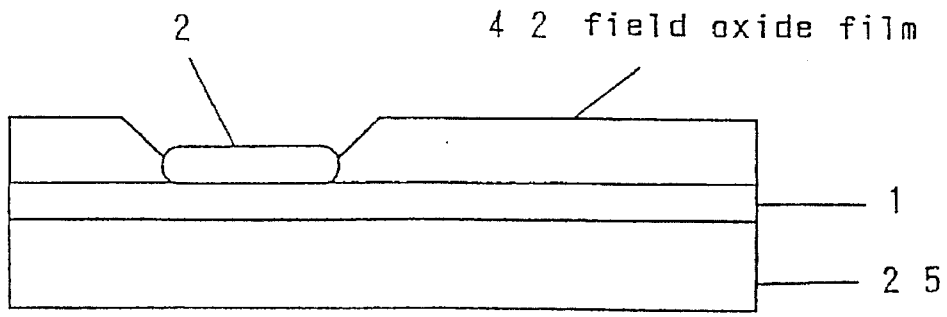

In the step shown in FIG. 12(D), after the photoresist is removed, a field oxide film 42 is formed by subjecting the single crystal silicon thin film 2 to a thermal oxidizing process while the silicon oxide protective film 39 and the silicon nitride protective film 40 covering the element region are used as a mask. The single crystal silicon thin film 2 is left in a region surrounded by the field oxide film 42 to form an element region. Then the silicon oxide protective film 39 and the silicon nitride protective film 40 acting as a mask are removed.

Figure 13A:
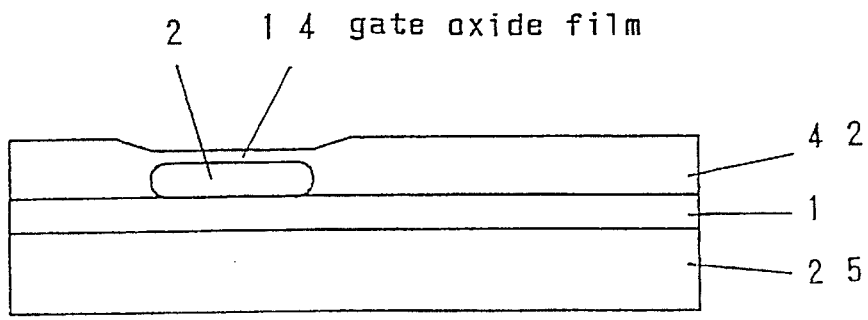
FIG. 13A–13D is a flow chart illustrating the fine processing step in the first step in the semiconductor thin film element manufacturing process according to the present invention.

In the step shown in FIG. 13(A), a gate oxide film 14 is formed on the surface of the single crystal silicon thin film 2 by performing a thermal oxidizing process again.

Figure 13B:
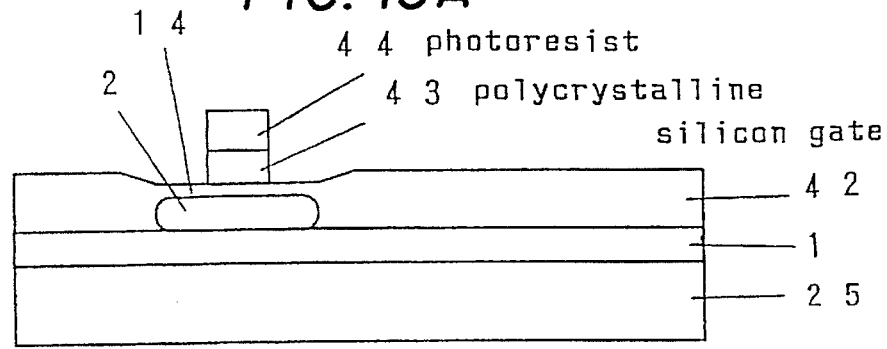

In the step shown in FIG. 13(B), a polycrystalline silicon film is deposited using a chemical vapor deposition process. The polycrystalline silicon film is selectively removed using a photoresit 44 patterned in a desired form to form a polycrystalline silicon gate 43 on the gate oxide film 14.

Figure 13C:
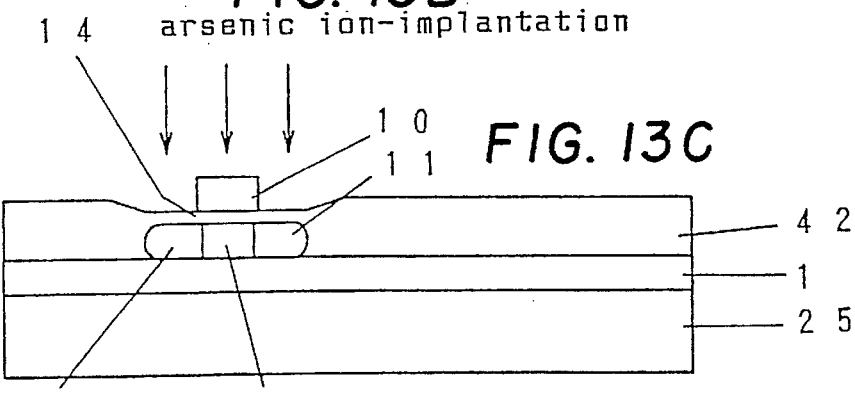

In the step shown in FIG. 13(C), after the photoresist 44 is removed, arsenic impurities are ion-implanted through the gate oxide film 14 with the gate electrode 10 used as a mask to form a drain region 12 and a source region 11 in the single crystal silicon thin film 2. As a result, a transistor channel forming region 45 in which arsenic impurities are not implanted is formed between the drain region 12 and the source region 11 under the gate electrode 10.

Figure 13D:
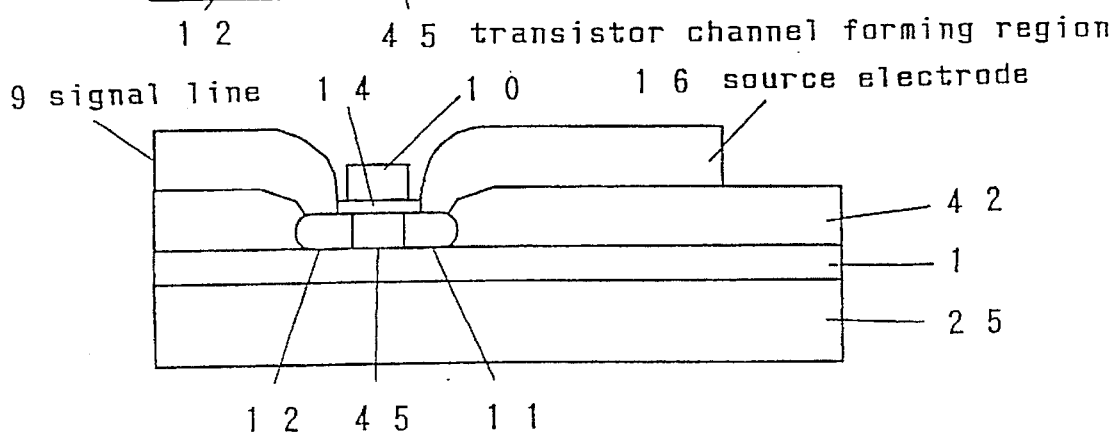

In the step shown in FIG. 13(D), the gate oxide film 14 on the drain region 12 is partially removed to form a contact hole connected with a signal line 9. In the similar manner, the gate oxide film 14 on the source 11 is partially removed to form a contact hole and the source electrode 16 is formed so as to cover the hole. The source electrode 16 is formed of a transparent electrode such as ITO. The field oxide film 42 and the thermally oxidized silicon film 1 are transparent also. If a glass substrate such as Pyrex glass is used as the supporting substrate 6, the four-layered structure made of the source electrode 16, the field oxide film 42, the thermally oxidized silicon film 1, and the glass substrate 6 is transparent optically. The transparent substrate on which thin film transistors is formed is obtained. The substrate can be applied to a transparent optical system.

As described above, in the manufacturing method shown in FIGS. 12 and 13, a high quality single crystal silicon thin film is subjected to a high temperature film forming process, a high resolution photolithographic etching, and ion implanting process. Thus a field effect type insulating gate transistor can be formed to an order of micron or submicron size. Since the single crystal silicon thin film used has very high quality, the insulating gate type transistor thus obtained has good electrical characteristics.

Figure 7:
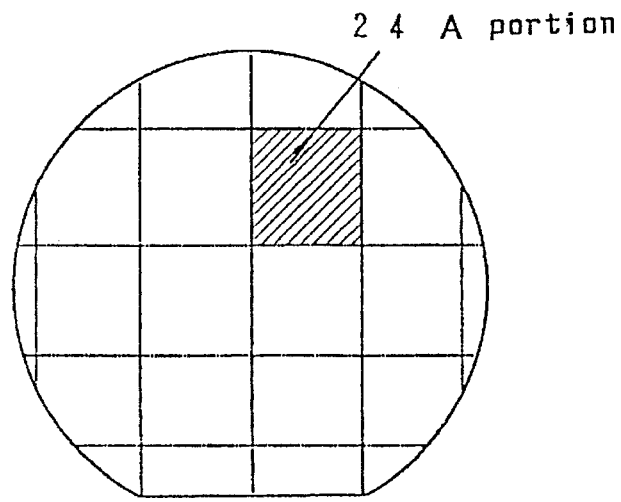
FIG. 7 is a typical diagram showing a structure of a semiconductor thin film element according to the present invention or a plan view of a substrate.
Figure 8:
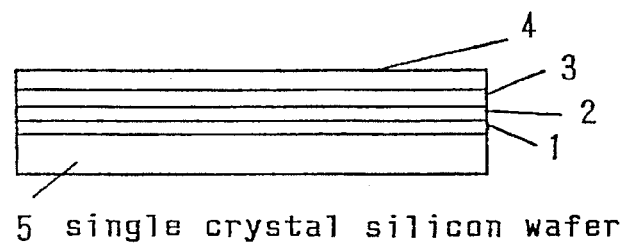
FIG. 8 is a structural cross-sectional view showing a substrate for a semiconductor thin film element according to the present invention.

The semiconductor thin film element structure according the present invention thus formed will be explained again. FIGS. 7 through 11 shows a semiconductor circuit element structure formed in the SOI substrate where the semiconductor thin film elements according to the present invention shown in FIGS. 1 through 6 have not been formed yet. FIG. 7 is a plan view showing the SOI substrate used for the present invention and FIG. 8 is the model cross sectional view showing the same. As shown in the figures, the SOI substrate has, for example, a 6-inch wafer shape. The SOI substrate has a five-layered structure which is formed of the single crystal silicon wafer 25, the thermally oxidized silicon film 1 formed on the wafer 25, the single crystal silicon thin film 2, the silicon oxide or silicon nitride film 3, and the element smoothing layer 4 made of silicon oxide or imide series resin. A semiconductor circuit element is formed on the single crystal silicon wafer 2 by performing the fine processing technique.

Figure 9:
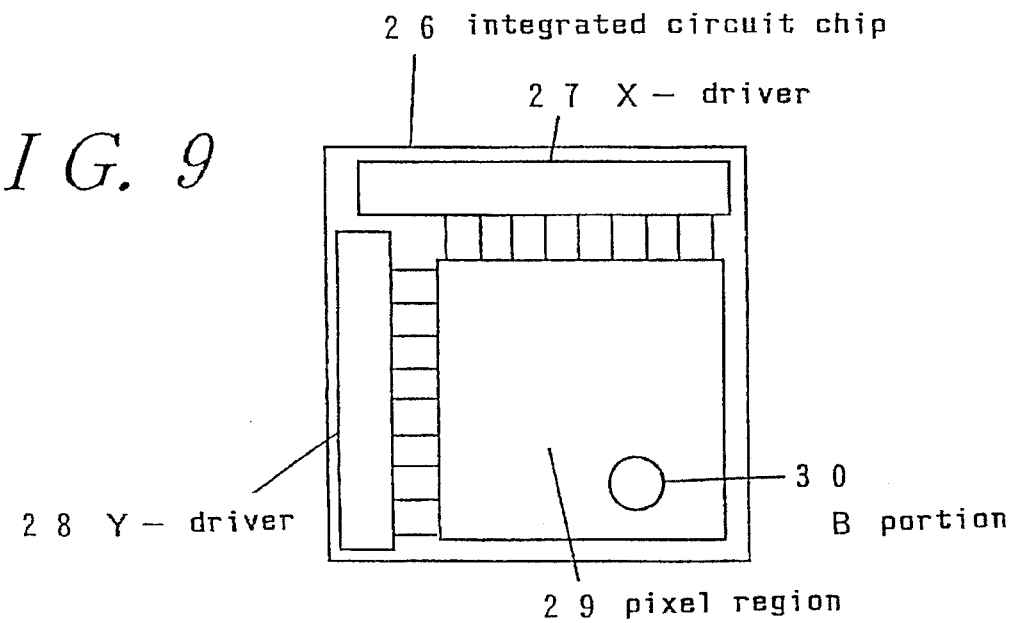
FIG. 9 is a layout diagram of an integrated circuit chip formed in the substrate of a semiconductor thin film element according to the present invention.

FIG. 9 is an enlarged view of the above integrated circuit chip. As shown in the figure, the integrated circuit chip 26 has, for example, a length of side 1.5 cm. The integrated circuit chip 26 includes a pixel region 29, a X-drive region 27, and a Y-driver region 28. The pixel region 29 is formed of fine pixel electrodes arranged in a matrix form and integrated gate field effect transistors corresponding to the fine pixel electrodes, or PN type photo diodes arranged in a matrix form. The X-drive electrode region 27 is formed of a drive circuit or a X-driver for supplying electrical signals to the respective transistors formed of a Y-driver, for example, a scanning circuit for scanning sequentially the respective transistors or for scanning and detecting sequentially the respective photo diodes. According to the present invention, since the single crystal thin film has a higher mobility than that of amorphous thin film or polycrystalline thin film, X and Y drivers with high response characteristic can be formed on the same surface together with the pixel region.

Figure 11:
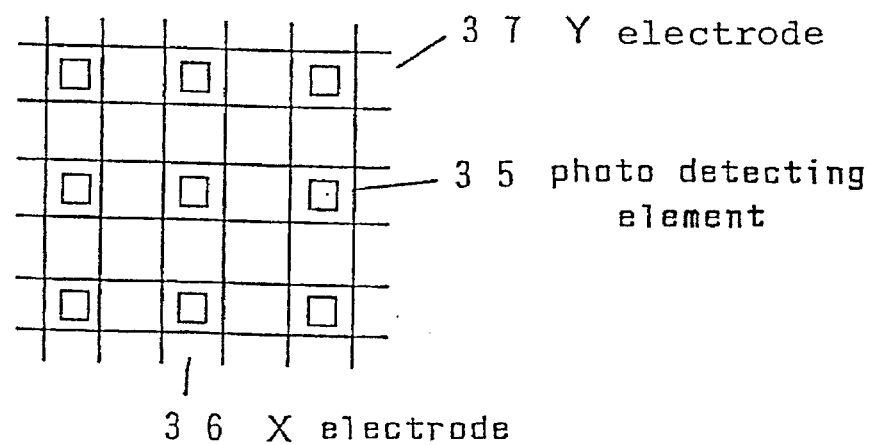
FIG. 11 is an enlarged diagram of B portion of an optical detector array in FIG. 9 where an integrated circuit chip of a semiconductor thin film element according to the present invention is used.

FIG. 11 is an enlarged diagram of B portion of an optical detector array in FIG. 9. A photo detecting element 35 is formed at each intersectional point of Y electrode 37 and X electrode 36.

Figure 10:
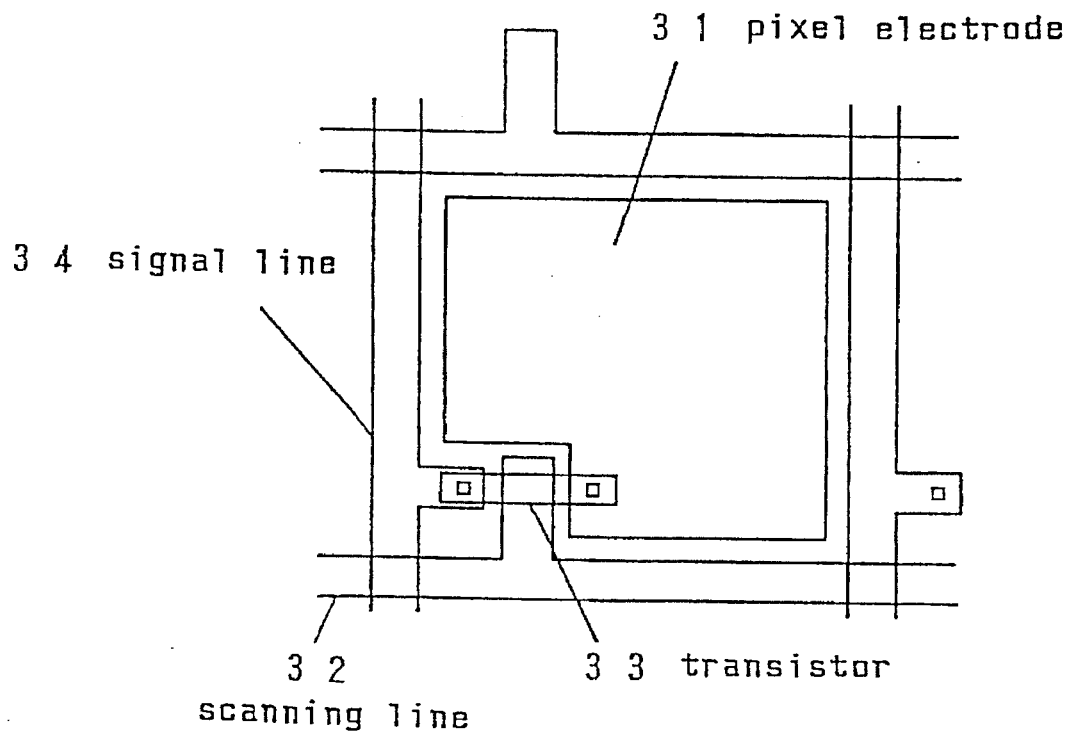
FIG. 10 is an enlarged diagram of the B portion in a liquid crystal light valve in FIG. 9 where an integrated circuit chip of a semiconductor thin film element according to the present invention is used.

FIG. 10 is a diagram showing an embodiment of a liquid crystal optical valving device formed on the above integrated circuit chip and enlarges the pixel region 29 in the B portion 30 of FIG. 9. That is, a single pixel of the liquid crystal optical valving device is shown. As shown in the figure, the pixel is formed of a pixel electrode 31, a transistor 33 for exciting in response to a signal on the pixel electrode 31, a signal line 34 for supplying a signal to the transistor 33, and a scanning line 32 for scanning the transistor 33. The signal line 34 is connected to the X-driver 27 and the scanning line 32 is connected to the Y-driver 28.

As described above, according to the present invention, the transistor 33 is consisted of a drain region formed of the single crystal silicon thin film 2, a source region, and a gate electrode formed on the channel region arranged between the drain region and the source region. That is, the transistor 33 is of an insulating gate field effect type. The gate electrode is formed of a part of the scanning line 32. The pixel electrode 31 is connected to the source region. The drain region is connected to a drain electrode formed of a part of the signal line 34.

Figure 16:
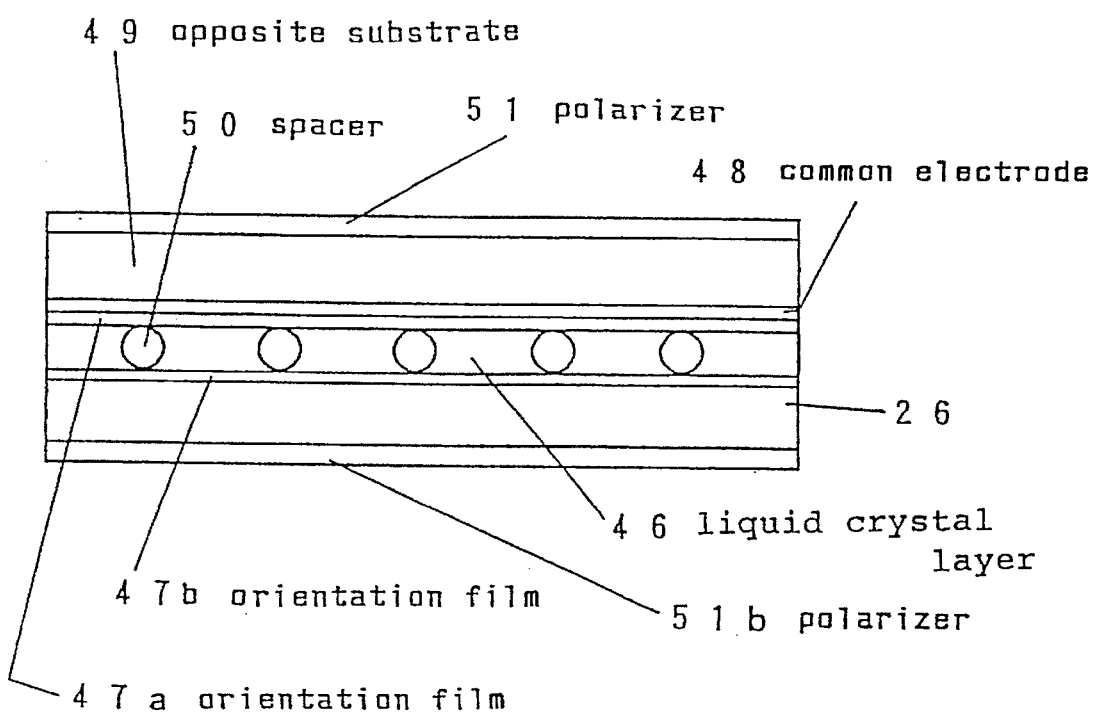
FIG. 16 is a typical cross sectional view showing a first embodiment of the semiconductor thin film element according to the present invention.

FIG. 16 is a model cross sectional view of a liquid crystal optical valving device according to the present invention. As shown in the figure, the liquid crystal optical valving device is consisted of an integrated circuit chip 26, an opposite substrate 48 arranged oppositely to the integrated circuit chip 26, and an electrooptic material layer, for instance, liquid crystal layer 46 arranged between the integrated circuit chip 26 and the opposite substrate 48. A pixel electrode or drive electrode for defining a pixel and a drive circuit for exciting said drive electrode in response to a predetermined signal are formed in the integrated circuit chip 26.

The liquid crystal layer 46 is held at a predetermined gap by the spacer 5a. The gap generally depends on the optical and orientation characteristics of a liquid crystal material used for the liquid crystal layer 46. For example, the gap generally is about 5 to 10 µm for nematic liquid crystal materials and is about 1 to 2 µm for ferroelectric liquid crystal materials. Fine particles finished in ball or fiber shape of transparent polymer material such as acrylic resin or silicon dioxide are used as the spacer. The spacers 50 may be dispersed uniformly over the entire element. It is desirable to arrange the spacers 50 only on the peripheral portion of the element except of the pixel region 29 in FIG. 9.

Furthermore, it is more desirable not to arrange the spacers 50 on the X-driver 27 and the Y-driver 28 because the spacers 50 on the pixel electrodes 31 may decrease the contrast of the element or may break the single crystal silicon thin film 2 when an pressure is applied to control the thickness of the liquid crystal layer 46. When the spacers 50 are arranged over the entire element, an adhesive agent having a Shore curing hardness of over 80 may be used for the resin adhesive layer 5, and an oxide silicon of a thickness of 1 to 2 µm is formed for the element smoothing layer 4, and the thermally oxidized silicon film 1 is controlled to the thickness of over 0.1 µm. Thus in order to control the thickness of the liquid crystal layer 46, a pressure can be applied in such a manner that the spacer 50 does not break the single crystal silicon thin film 2.

As shown in FIG. 1, the integrated circuit chip 26 has a six-layered structure which is constructed of the supporting substrate 6 of a Pyrex glass, the resin adhesive layer 5, the element smoothing layer 4, the silicon oxide layer 3, the single crystal silicon thin film 2, and the thermally oxidized silicon layer 1. Moreover a polarizer 51b is adhered on the back surface of a Pyrex supporting substrate 6. The drive circuit is made of an integrated circuit formed on the single crystal silicon thin film 2. The integrated circuit, as shown in FIG. 10, includes a plurality of field effect type insulating gate transistors 33 arranged in a matrix form. In the transistors 33, the source electrodes of the transistors 33 are connected to the corresponding pixel electrodes 31, the gate electrodes are connected to the scanning lines 32, and the drain electrodes are connected to the signal lines 34. The integrated circuit includes X-drivers 27 connected to the row signal lines 34.

The integrated circuit also Y-drivers 28 connected to the column scanning lines 32. The opposite substrate 49 of transparent material such as glass is made of the polarizer 51a adhered on the outer surface thereof, and the opposite elecrode or common electrode 48 formed on the inner surface of the opposite substrate 49. Furthermore, orientation films 47a, 47b for orienting liquid crystal molecules being electrooptic material layer are formed opposed to each other, on the inner surfaces which contact the liquid crystal layer 46 in both the integrated circuit chip 26 and the opposite substrate 49.

An embodiment which uses a nematic liquid crystal material as the liquid crystal layer 46 is shown below. The nematic liquid crystal material has a property that the major axis is oriented easily. As shown in FIG. 16, let us assume that a thing with polyimide films coated as the orientation films 47a and 47b and having rubbed surfaces thereof is prepared. In this case, when the rubbing direction of the orientation film 47a formed on the opposite substrate 49 is perpendicular to the rubbing direction of the orientation film 47b formed on the integrated circuit chip 26, the liquid crystal molecules between the substrates are twisted to 90°. As a result the polarizing angle of light passing the liquid crystal 46 is rotated at 90°. When an electric field is applied between the pixel electrode 31 formed on the integrated circuit chip 26 and the common electrode 48 formed on the opposite electrode 49, the liquid crystal molecules are arranged vertically with respect to the electric field or the substrate so as to lose its optical activity. The transition is detected optically with a pair of polarizer 51a and 51b arranged on both sides of the substrate. This means that a light passing through the liquid crystal layer is passed or blocked in the absence or presence of voltage. In such a manner, the light valving according to the present invention has an light valving function for each of the pixels.

An explanation will be made as for the liquid crystal light valve referring to FIGS. 7 to 11 and FIG. 16. As shown in FIGS. 7 to 11, the gate electrode of the transistor 33 is connected to the scanning line 32. The Y-driver 28 supplies a scanning signal sequentially to control an on/off operation of the transistors 33. The X-driver 27 applies a display signal to a selected transistor 33 in on state via a signal line 34. The applied display signal excites the corresponding pixel electrode 31. Thus an electric field is produced between the pixel electrode 31 and the common electrode 48 shown in FIG. 16 and effects the liquid crystal layer 46 so as to maximize substantially its transparency.

On the other hand, in the non selection state, the transistor 33 is in off state and holds a display signal written to the pixel electrode as an electric charge. The liquid crystal layer 46 has a high specific resistance and acts usually as a capacitive element. An on/off current ratio is used to show the switching characteristic of the drive transistor 33. The current ratio necessary for a liquid crystal operation can be easily determined by the writing time and the holding time. For example, when the displaying is a television signal, 90% of a display signal may be written during about 60 μ second for one scanning term. On the other hand, 90% of the electric charges must be held in about 16 milliseconds for one field term. According to the present invention, the transistor 33 is formed on a single crystal silicon thin film 2 with high electric charge mobility, the on/off current ratio of six figures or more can be obtained. Hence an active matrix type liquid crystal light valve with very fast signal response is available. The high mobility characteristic of the single crystal silicon thin film 2 makes it possible to form the peripheral driver circuits 27 and 28 on the same single crystal silicon thin film.

Figure 18:
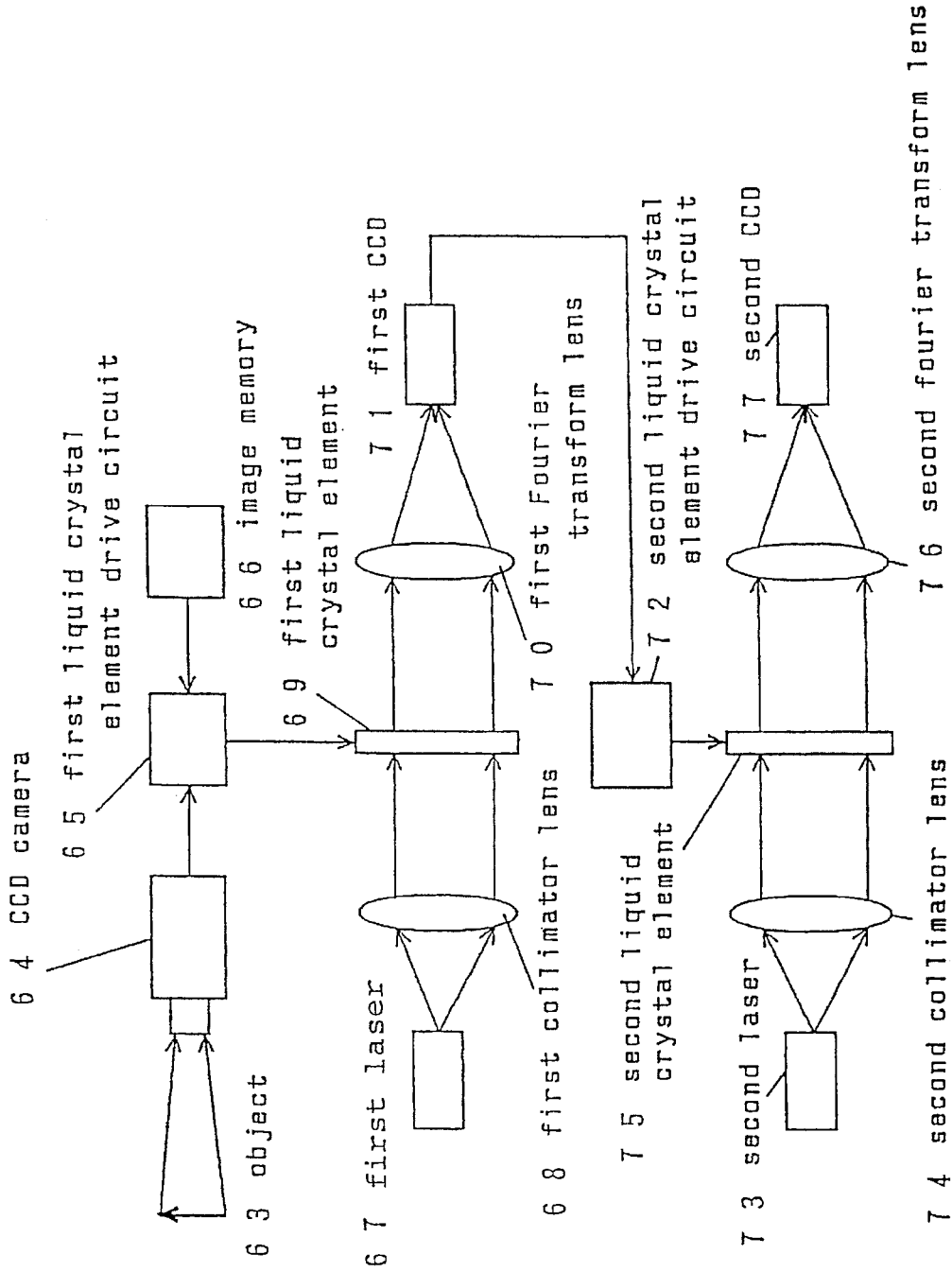
FIG. 18 is a structural view showing an embodiment where a liquid crystal light valve using an semiconductor thin film element according to the present invention is applied to an optical correlation device.
Figure 19:
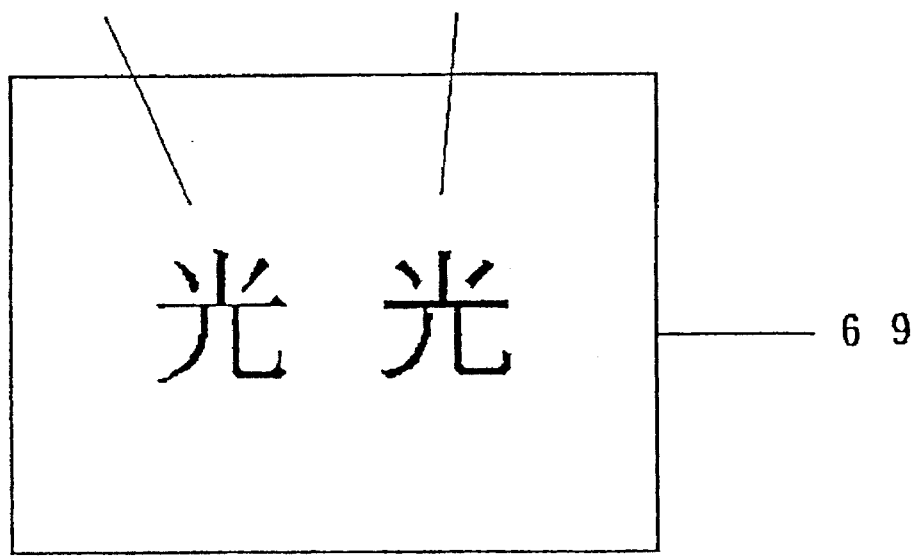
FIG. 19 is a diagram showing an embodiment of an input image to an optical correlation device.

FIG. 18 shows an optical correlation device being an embodiment applying the liquid crystal light valve formed according to the present invention. In FIG. 18, a first liquid crystal device 69 and a second liquid crystal device 75 are the liquid crystal light valve, respectively. The liquid crystal light vlave integrates a 18×20 μm pixel electrode numbering 480×720 pixels within an about 20 mm square pixel region. The liquid crystal light valve device employs a 5 μm thick nematic liquid crystal as a liquid crystal material and has a contrast ratio of 50 to 100. An image is driven in response to video signals from the first liquid crystal device drive circuit 65 and the second liquid crystal device drive circuit 72. The image of an object 63 taken by a CCD camera 64 is combined with the reference image from an image memory 66 by means of the first liquid crystal device drive circuit 65 to display the outcome on the first liquid crystal device 69. In FIG. 19, the input image 78 corresponds to the image of the object 63 and the reference image 79 corresponds to the reference image. In FIG. 19, the object 63 is a Chinese character "Hikari" in Mincyotai type and the reference image is a Chinese character "Hikari" in Gothic type. The image of the object 63 and the reference image are displayed side by side on the first liquid crystal device.

The input image 78 and the reference image 79 displayed on the first liquid crystal device 69 are converted to an optical image by the coherent light which is obtained by converting light emitted from the first laser 67 to parallel rays with a first collimator lens 68. The optical image is subjected to a Fourier transformation on the photoelectric conversion surface of a first CCD 71 using a first Fourier transform lens 70. The first liquid crystal device 69 is arranged at the front focus of the first Fourier transform lens 70 and the photoelectric conversion surface of the first CCD 71 is arranged at the back focus of the first Fourier transform lens 70. The Fourier transform image obtained is called a joint Fourier transform image which is resulted from an interference between the Fourier transform image of input image 78 and the Fourier transform image of reference image 79.

The joint Fourier transform image produced from the first CCD 71 is displayed on the second liquid crystal device 75 by way of the second liquid crystal device drive circuit 72. The joint Fourier transform image displayed on the second liquid crystal device 75 is read using the coherent light which is emitted from the second laser and converted to parallel rays with the second collimator lens 74. Then the coherent light is subjected again to a Fourier transform on the photoelectric conversion surface of the second CCD 77 using the second Fourier transform lens 76. The second Fourier liquid crystal element 75 is arranged at the front focus of the second Fourier transform lens 76 and the photoelectric surface of the second CCD 77 is arranged at the back focus of the second Fourier transform lens 76. The Fourier transform image of the joint Fourier transform image taken by the second CCD 77 contains a pair of correlation peaks and other DC bias components, the correlation peaks corresponding to the correlation coefficient between the input image 78 and the reference image 77. The analogy between the input image and the reference image can be judged by measuring the strength of the correlation peak.

In the present embodiment, the optical correlation device is called a joint conversion correlation device (or congruence conversion correlation device). It is expected that the optical correlation device can analyze an actual time of an image and can recognize accurately characters with different fonts as shown in FIG. 18.

Many correlation devices of the above type have been studied vigorously. However there have been no display devices such as the first liquid crystal device for inputting an image and the second liquid crystal device for displaying a joint Fourier transform image. Most conventional display devices of the above type are of an active matrix type liquid crystal display device which includes transistors formed on an amorphous silicon thin film and are commercially available for liquid crystal television and the similar devices. The conventional liquid crystal display device cannot include pixels of less than 100 µm and cannot operate at a high speed of about 100 Hz because of the manufactural limit of the amorphous silicon thin film and the limited electric charge mobility. If it is intended to make the display device according to the present embodiment with a large number of pixels, the display device itself will be large. Therefore there is a disadvantage in that the optical correlation device system is constructed largely as a whole.

Moreover, according to the optical correlation device, the input image 78 and the reference image 79 displayed on the first liquid crystal device 69 must be sufficiently small and be close to each other, in order to produce a sufficient large interference fringe to detect with the first CCD 77. The interference fringe of a joint Fourier transform image displayed on the second liquid crystal element 75 must be as thin as possible because the long focus distance of the second Fourier transform lens 76 makes the system be large.

In the present embodiment, the liquid crystal device employing the semiconductor thin film element accroding to the present invention can solve the above problems and can reduce structurally the optical correlation device to about ⅓ in comparison with the use of the conventional liquid crystal display device. In the present embodiment, the first liquid crystal device as well as the second liquid crystal device are operated at a video rate. It can be realized that the CCD camera 64, the first CCD 71, and the second CCD 77 is improved to transmit images at a video rate or more, or substantially at an operational speed of an order of 100 Hz.

It has been explained that the liquid crystal device employing the semiconductor thin film element according to the present invention is of a nematic liquid crystal material. Furthermore, it is possible to construct a display element which provides a high contrast at high speed by controlling the thickness of liquid crystal material or ferroelectric liquid crystal to about 2 µm.

Figure 17:
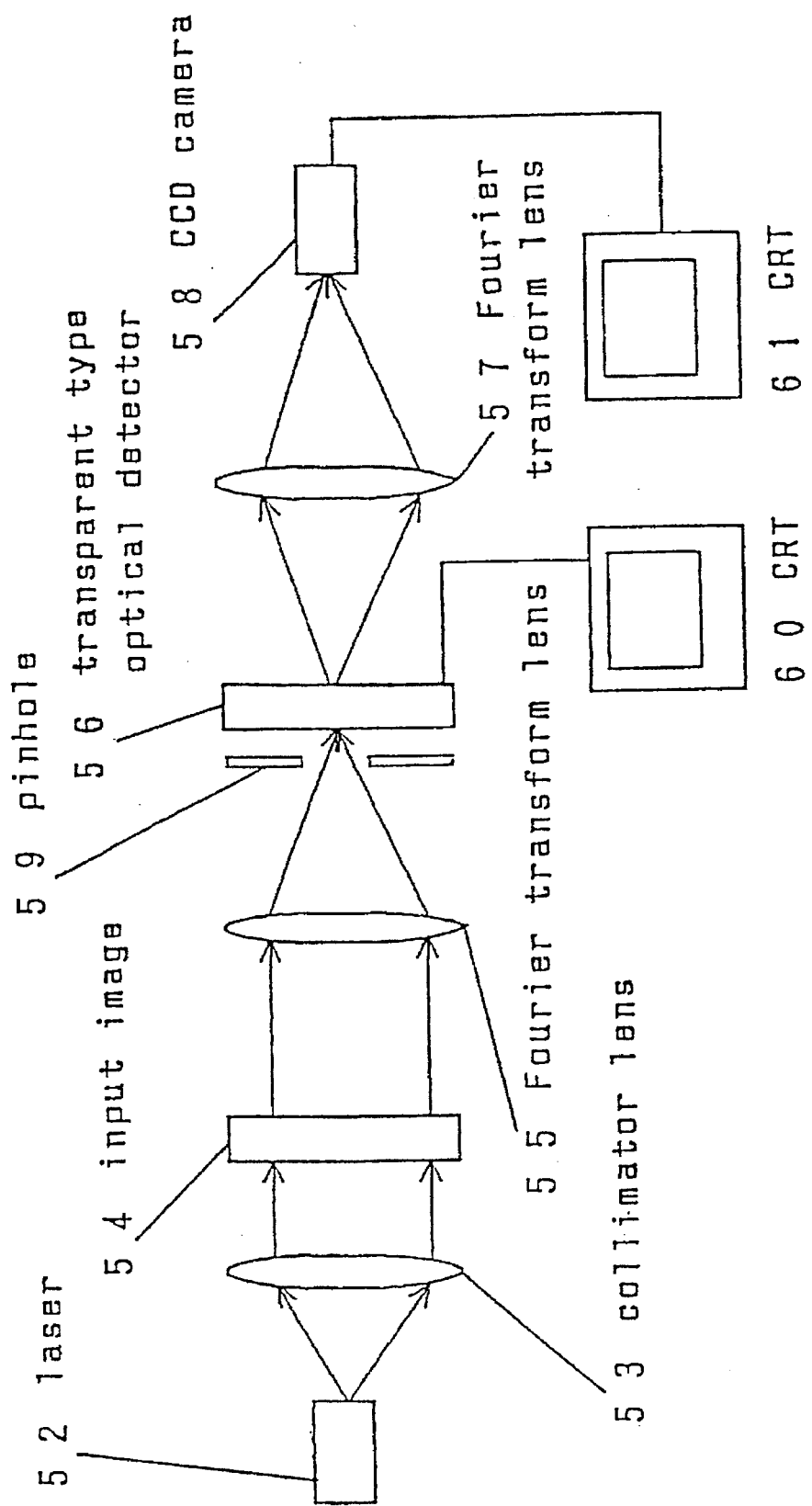
FIG. 17 is a structural view showing an embodiment where an semiconductor thin film element according to the present invention is applied to an optical detector.

Next embodiment shows an application where an optical detector is constructed in the semiconductor thin film element according to the present invention. FIG. 17 is an embodiment showing an embodiment where an optical detector is constructed to the semiconductor thin film element shown in FIGS. 6 and 11 according to the present invention and is used as a transparent type optical detector. In FIG. 17, numeral 54 is an input image being a silver chloride photographic plate recording an observing object, and 56 is a transparent type optical detector using the semiconductor thin film element according to the present invention. Light emitted from the laser 52 is converted to parallel rays with the collimator lens 53 and then is illuminated to the input image 54 to read out it. After a specific high-frequency component of the input image 54 read out is filtered using a pinhole 59, it is subjected to a Fourier transform on the light receiving surface of the transparent type optical detector using the Fourier transform lens 55. The input image subjected to the Fourier transform passed through the transparent type optical detector 56 is subjected again to a Fourier transform using the Fourier transform lens 57 to regain the original input image. The outcome is taken by the CCD camera 58 and is observed using the CRT 61. The noise in the input image reproduced with the CCD camera 58 can be controlled by adjusting properly the diameter of the pinhole 59.

It is an important matter to observe that what portion of the Fourier transform image of an input image is being filtered when an input image is repaired by using a special frequency filter. Usually a proper transparent type optical detector are not available. Hence a beam splitter is arranged at the place where the Fourier transform lens 55 and the transparent type detector 56 are arranged to split the beam and then the split beam is observed with another CCD camera. In this case, pinholes must be arranged separately for two Fourier transform surface of the split Fourier transform images. It is difficult to verify whether the respective pinholes are arranged on the same place on the Fourier transform surface. On the contrary, the simple structure of the present embodiment shown in FIG. 17 can achieve the above observation on the CRT 60.

In spite of the above embodiment, the transparent type optical detector employing the semiconductor thin film element according to the present invention can measure light strength without shielding light. The resolution equivalent to that of the CCD enables wider applications in the optical measuring field.

As described above, the semiconductor thin film element according to the present invention has a laminated structure where a thermally oxidized silicon film, a single crystal silicon thin film sandwiched between silicon oxide films or silicon nitride films and on which a semiconductor circuit element is formed, an element smoothing layer, a resin adhesive layer, and a supporting substrate are formed sequentially. Thus a single crystal silicon thin film with good electric charge mobility and electrical characteristics can be made. The thin film makes it possible to form a liquid crystal light valve with fine pixels and a large number of pixels and to form an optical detector with good light transparency. Hence it is possible to display and measure fine images.

According to the semiconductor thin film element manufacturing method, after a second single crystal silicon wafer is thermo-press bonded on a first single crystal silicon wafer, a single crystal silicon thin film is formed by polishing and etching the second single crystal silicon wafer. Then a semiconductor thin film element is manufactured through a first step of forming integrally semiconductor thin film elements on the single crystal silicon thin film and a second step of forming bonding and then separating the semiconductor elements formed on the single crystal silicon thin film on a supporting substrate.

The present invention can easily make the above semiconductor thin film element which has been difficult to do using the prior art. The present invention also contributes largely to the technical field on a bonding between a semiconductor and a different kind of material and a three-dimensional semiconductor element structure.

Particularly, the liquid crystal light valve employing the semiconductor thin film element can be a liquid crystal display device with pixels each having a 5 to 20 m square near to a light wavelength. Since a conventional coherent light using display can provide a image quality analogous to that of a photograph film, the liquid crystal display device contributes largely and technically to a high resolution display device such as a projector. By constructing an optical correlation device with a CCD, the coherent light using device makes possible it to miniaturize and provide higher resolution power of the optical correlation device. Furthermore, the pixel with a size near to light wavelength may be applied to a multi-filter type optical correlation device and a three-dimensional display by displaying a CGH (Computer Generated Hologram) hologram using coherent light. In addition, The present invention contributes largely to displaying load matrix such as optical neural network and various optical information processing technology regarding optical digital computing.

What is claimed is:

1. A semiconductor substrate comprising: a single crystal semiconductor thin film layer having an element region which includes at least a portion of a first surface thereof; an element smoothing layer formed on the element region of the single crystal semiconductor thin film layer; and a supporting substrate laminated to the element smoothing layer by a resin adhesive layer such that a rough surface formed by a circuit element formed on the first surface of the single crystal semiconductor thin film layer is smoothed by the element smoothing layer to avoid separation of the semiconductor thin film layer and the supporting substrate.

2. A semiconductor substrate according to claim 1; further comprising an insulating layer formed between the element smoothing layer and the single crystal semiconductor thin film layer to release an internal stress in the single crystal semiconductor thin film layer for protecting a circuit element formed thereon; and a silicon oxide layer formed on a surface of the single crystal silicon thin film layer at the opposite side of the insulating layer.

3. A semiconductor substrate according to claim 1; wherein the supporting substrate comprises a single crystal silicon substrate.

4. A semiconductor substrate according to claim 1; wherein the supporting substrate comprises a glass substrate.

5. A semiconductor substrate according to claim 1; wherein the resin adhesive layer comprises a material selected from an imide type resin and an epoxy type resin.

6. A semiconductor substrate according to claim 5; wherein the resin adhesive layer includes fluorine.

7. A semiconductor substrate according to claim 1; wherein the element smoothing layer comprises a silicon oxide film.

8. A semiconductor substrate according to claim 1; wherein the element smoothing layer comprises a material selected from an imide type resin and an epoxy type resin.

9. A semiconductor substrate according to claim 1; wherein the resin adhesive has a Shore hardness of at least 80.

10. A semiconductor substrate according to claim 1; wherein the resin adhesive layer includes a plurality of dispersed fine particles.

11. A semiconductor substrate according to claim 1; wherein the difference in linear coefficient of expansion between the supporting substrate and the single crystal semiconductor thin film layer is less than $1.5 \times 10^{-6}/°$ C.

12. A semiconductor substrate according to claim 1; further comprising an insulated gate field effect transistor having a source region and a drain region formed in the element region of the single crystal semiconductor thin film layer, a channel region formed in the element region of the single crystal semiconductor thin film layer between the source region and the drain region, an insulating film formed over the channel region, and a gate electrode formed over the insulating film.

13. A semiconductor substrate according to claim 1; further comprising an optical detecting element comprising a PN junction formed in the element region of the single crystal semiconductor thin film layer.

14. A semiconductor substrate according to claim 13; wherein the optical detecting element includes a PIN type junction comprising a P-type region formed in the element region of the single crystal semiconductor thin film layer, an I-type region interfacing with the P-type region, and an N-type region interfacing with the I-type region.

15. A semiconductor substrate according to claim 1; further comprising a second semiconductor thin film layer having a second element region which includes at least a portion of a first surface thereof, and a second element smoothing layer formed on the second element region of the second semiconductor thin film layer, the second semiconductor thin film layer and the second element smoothing layer being formed between the resin adhesive layer and the single crystal semiconductor thin film layer such that a rough surface formed by a second circuit element formed in the first surface of the second semiconductor thin film layer is smoothed by the second element smoothing layer to avoid separation of the single crystal semiconductor thin film layer, the second semiconductor thin film layer, and the supporting substrate.

16. A semiconductor substrate according to claim 15; wherein the second circuit element formed in the second semiconductor thin film layer is electrically connected to the circuit element formed on the single crystal semiconductor thin film layer through a joint hole formed in the second element smoothing layer and the resin adhesive layer.

17. A liquid crystal light valve comprising: a drive substrate having a drive electrode and a drive circuit for electrically exciting the drive electrode; an opposite substrate opposing the drive substrate; and a liquid crystal layer formed between the drive substrate and the opposite substrate; wherein the drive substrate comprises a single crystal semiconductor thin film layer, an element smoothing layer formed on the single crystal semiconductor thin film layer, a supporting substrate laminated on the element smoothing layer by a resin adhesive layer and a semiconductor circuit element formed in a surface of the single crystal semiconductor thin film layer contacting the element smoothing layer, such that the element smoothing layer is effective to smooth a rough surface formed by the semiconductor circuit element to avoid separation of the semiconductor thin film layer and the supporting substrate; and wherein the drive circuit comprised of the semiconductor circuit element and the drive electrode is arranged integrally on the single crystal semiconductor thin film layer, whereby an optical transmittance through the light valve is controlled by applying a voltage across the liquid crystal layer when the drive electrode is electrically excited by the drive circuit.

18. A liquid crystal light valve according to claim 17; wherein the resin adhesive layer comprises a material selected from an imide type resin and an epoxy type resin.

19. A liquid crystal light valve according to claim 17; wherein the drive circuit includes a plurality of drive elements arranged in a matrix form, the drive electrode is formed of a plurality of pixel electrodes arranged in a matrix form, and wherein respective pixel electrodes are selectively excited by corresponding ones of the drive elements.

20. A semiconductor optical detector comprising: a semiconductor optical detecting element; and a drive electrode connected to and exciting the semiconductor optical detecting element in accordance with a predetermined signal; wherein the semiconductor optical detecting element and the drive electrode are formed in a drive substrate comprising a single crystal semiconductor thin film bonded to a supporting substrate; the semiconductor optical detecting element being formed in the single crystal semiconductor thin film, and the drive electrode being formed integrally on the single crystal semiconductor thin film, whereby an optical detection signal is controlled by activating the optical detecting element when the drive electrode is excited by a drive circuit.

21. A semiconductor optical detector according to claim 20; wherein the optical detecting element is arranged in a matrix form and comprises a plurality of silicon photodiodes, the drive electrode comprises a plurality of corresponding drive electrodes, and the drive circuit includes means for scanning and detecting optical detection signals from the silicon photodiodes.

22. A semiconductor substrate comprising: a semiconductor thin film having a first device region; a smoothing layer formed on the semiconductor thin film and contacting the first device region to smooth a rough surface formed by a circuit element formed in the first device region; and a supporting substrate laminated to the smoothing layer by an adhesive layer such that separation of the semiconductor thin film and the supporting substrate is prevented by the smoothing layer.

23. A semiconductor substrate according to claim 22; further comprising an insulation layer formed between the smoothing layer and the semiconductor thin film effective to release an internal stress in the semiconductor thin film for protecting the first device region.

24. A semiconductor substrate according to claim 22; wherein the supporting substrate comprises single crystal silicon.

25. A semiconductor substrate according to claim 22; wherein the supporting substrate comprises a transparent material.

26. A semiconductor substrate according to claim 25; wherein the transparent material comprises glass.

27. A semiconductor substrate according to claim 25; wherein the transparent material comprises quartz.

28. A semiconductor substrate according to claim 22; wherein the adhesive layer comprises a material selected from an imide type resin and an epoxy type resin.

29. A semiconductor substrate according to claim 22; wherein the adhesive layer includes fluorine.

30. A semiconductor substrate according to claim 22; wherein the smoothing layer comprises a silicon dioxide film.

31. A semiconductor substrate according to claim 22; wherein the smoothing layer comprises a material selected from an imide type resin and an epoxy type resin.

32. A semiconductor substrate according to claim 22; wherein the adhesive has a Shore hardness of at least 80.

33. A semiconductor substrate according to claim 22; wherein the adhesive layer includes fine particles dispersed throughout.

34. A semiconductor substrate according to claim 22; wherein the difference in linear coefficient of expansion between the supporting substrate and the semiconductor thin film is less than $1.5 \times 10^{-6}/°$ C.

35. A semiconductor substrate according to claim 22; further including an insulated gate field effect transistor having a source region and a drain region formed in the first device region of the semiconductor thin film, a channel region formed between the source region and the drain region, and a gate electrode formed over the channel region.

36. A semiconductor substrate according to claim 22; further including an optical detecting element comprising a PN junction formed in the first device region of the semiconductor thin film.

37. A semiconductor substrate according to claim 36; wherein the optical detecting element includes a PIN type junction comprising a P-type region formed in the semiconductor thin film, an I-type region interfacing with the P-type region, and an N-type region interfacing with the I-type region.

38. A semiconductor substrate according to claim 36; further comprising a second smoothing layer formed between the adhesive layer and the supporting substrate; and a second device region formed in a surface of the supporting substrate contacting the second smoothing layer.

39. A semiconductor substrate according to claim 38; wherein the second device region formed in the supporting substrate is electrically connected to the first device region formed in the semiconductor thin film through a joint hole formed in the second smoothing layer and the adhesive layer.

40. A semiconductor substrate according to claim 1; further comprising a second element region which includes at least a portion of a first surface of the supporting substrate, and a second element smoothing layer formed between the resin adhesive layer and the first surface of the supporting substrate to smooth a rough surface formed by a circuit element formed in the second element region of the supporting substrate to avoid separation between the supporting substrate and the single crystal semiconductor thin film layer.

41. A semiconductor substrate according to claim 40; wherein a first circuit element formed in the element region of the single crystal semiconductor thin film layer is electrically connected to a second circuit element formed in the second element region of the supporting substrate through a joint hole formed in the resin adhesive layer and the second element smoothing layer.

42. A semiconductor substrate comprising: a first semiconductor thin film layer having a first element region which includes at least a portion of a first surface thereof; a first element smoothing layer formed over the first element region; a second semiconductor thin film layer having a second element region which includes at least a portion of a first surface thereof; a second element smoothing layer formed over the second element region; a first adhesive film layer for bonding the first semiconductor thin film layer and the first element smoothing layer to the second semiconductor thin film layer and the second element smoothing layer to form a multilayer circuit; and a supporting substrate bonded to the multilayer circuit by a second adhesive layer; wherein the first element smoothing layer is effective to smooth a rough surface formed by a circuit element formed in the first element region of the first semiconductor thin film, and the second element smoothing layer is effective to smooth a rough surface formed by a circuit element formed in the second element region of the second semiconductor thin film to thereby avoid separation of the first and second semiconductor thin film layers and the supporting substrate.

43. A semiconductor substrate comprising: a semiconductor thin film layer having a first element region which includes at least a first surface thereof; a first element smoothing layer formed on the first element region; a supporting substrate for supporting the semiconductor thin film layer; and an adhesive layer for bonding the supporting substrate and the semiconductor thin film layer on the side having the first element smoothing layer; wherein the first element smoothing layer is effective to smooth a rough surface caused by a circuit element formed in the first element region to avoid separation of the semiconductor thin film layer and the supporting substrate.

44. A semiconductor substrate according to claim 43; wherein the semiconductor thin film layer comprises a single crystal silicon thin film layer.

45. A semiconductor substrate according to claim 43; wherein the semiconductor thin film layer comprises a thinned single crystal silicon wafer.

46. A semiconductor substrate according to claim 43; further comprising a first insulating layer formed between the first element smoothing layer and the first surface of the semiconductor thin film layer to release an internal stress in the semiconductor thin film layer for protecting a circuit element formed in the element region.

47. A semiconductor substrate according to claim 46; further comprising a second insulating layer formed on a second surface of the semiconductor thin film opposite the first surface.

48. A semiconductor substrate according to claim 43; further comprising a second element region formed in the supporting substrate and including at least a portion of a first surface thereof, and a second element smoothing layer formed between the adhesive layer and the first surface of the supporting substrate to smooth a rough surface caused by a circuit element formed in the second element region of the supporting substrate to prevent separation of the semiconductor thin film layer and the supporting substrate.

49. A semiconductor substrate according to claim 48; wherein a circuit element formed in the first element region of the semiconductor thin film layer is electrically connected to a circuit element formed in the second element region of the supporting substrate through a joint hole formed in the second element smoothing layer and the adhesive layer.

* * * * *